(12) United States Patent
Kim

(10) Patent No.: US 10,122,378 B2
(45) Date of Patent: Nov. 6, 2018

(54) DIGITAL-TO-TIME CONVERTER AND OPERATING METHOD THEREOF

(71) Applicant: Samsung Electronics Co., Ltd., Suwon-si, Gyeonggi-do (KR)

(72) Inventor: Nam-seog Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/869,854

(22) Filed: Jan. 12, 2018

(65) Prior Publication Data

US 2018/0269895 A1 Sep. 20, 2018

(30) Foreign Application Priority Data

Mar. 16, 2017 (KR) .......................... 10-2017-0033209
Aug. 14, 2017 (KR) .......................... 10-2017-0103208

(51) Int. Cl.
*H03M 1/82* (2006.01)
*H03M 1/78* (2006.01)
*H03K 5/135* (2006.01)
*G04F 10/00* (2006.01)
*H03F 3/217* (2006.01)
(Continued)

(52) U.S. Cl.
CPC .......... *H03M 1/825* (2013.01); *G04F 10/005* (2013.01); *H03F 3/2175* (2013.01); *H03K 5/131* (2013.01); *H03K 5/135* (2013.01); *H03L 7/097* (2013.01); *H03M 1/785* (2013.01)

(58) Field of Classification Search
CPC ........ H03M 1/825; H03M 1/82; H03M 1/785; H03M 1/50; H03M 1/66; H03M 1/747; H03K 5/131; H03K 5/135; H03K 5/13; H03L 7/097; H03F 3/2175; G04F 10/005; G04F 10/00

USPC .................................................. 341/144, 152
See application file for complete search history.

(56) References Cited

U.S. PATENT DOCUMENTS 6,657,420 B1 * 12/2003 Shacter ................... G05F 1/575
323/288
7,042,381 B1   5/2006 Pan
(Continued)

OTHER PUBLICATIONS

US 9,369,138, 06/2016, Caffee et al. (withdrawn)
(Continued)

*Primary Examiner* — Jean B Jeanglaude
(74) *Attorney, Agent, or Firm* — Harness, Dickey & Pierce, P.L.C.

(57) ABSTRACT

A digital-to-time converter includes: a digital-to-analog converter configured to generate a precharge voltage corresponding to a value of a digital code; a ramp generator configured to precharge a capacitor connected to a first node based on the precharge voltage, and to charge or discharge the capacitor based on a reference current provided from a current source in response to a transition of an input clock signal to generate a ramp voltage in the first node; and a comparator configured to generate an output clock signal based on the ramp voltage, wherein the ramp generator includes: a first switching circuit configured to provide a first current path between a second node connected to the current source and the first node; and a second switching circuit configured to provide a second current path from a power supply voltage source to the second node.

20 Claims, 17 Drawing Sheets

(51) Int. Cl.
*H03L 7/097* (2006.01)
*H03K 5/131* (2014.01)

(56) References Cited

U.S. PATENT DOCUMENTS

| | | | | |
|---|---|---|---|---|
| 7,884,748 B2* | 2/2011 | Delagnes | ............... | G04F 10/005 341/156 |
| 8,368,578 B2* | 2/2013 | Harpe | ............... | H03M 1/56 341/118 |
| 8,860,514 B2 | 10/2014 | Weltin-Wu et al. | | |
| 8,994,573 B2* | 3/2015 | Henzler | ............... | G04F 10/005 341/144 |
| 9,065,478 B1* | 6/2015 | Kim | ............... | H03M 1/661 |
| 9,071,304 B2 | 6/2015 | Banin et al. | | |
| 9,130,588 B2 | 9/2015 | Henzler et al. | | |
| 9,137,084 B2 | 9/2015 | Degani et al. | | |
| 9,270,288 B2* | 2/2016 | Perrott | ............... | H03L 7/093 |
| 9,362,936 B1 | 6/2016 | Caffee et al. | | |
| 9,520,890 B1 | 12/2016 | Ben-Bassat et al. | | |
| 2007/0222493 A1 | 9/2007 | Afentakis et al. | | |
| 2008/0272952 A1* | 11/2008 | Wood | ............... | G04F 10/005 341/166 |
| 2015/0116012 A1* | 4/2015 | Lakdawala | ............... | H03K 4/12 327/136 |
| 2015/0381214 A1 | 12/2015 | Tertinek et al. | | |

OTHER PUBLICATIONS

Pavlovic et. al A 5.3 GHz Digital-to-Time-Converter-Based Fractional-N-All-Digital PLL. 2011 IEEE International Solid-State Circuits Conference. ISSCC 2011, Session 3.

Staszewski et. al. Spur-Free Multirate All-Digital PLL for Mobile Phones in 65 mm CMOS. IEEE Journal of Solid-State Circuits vol. 46, No. 12, Dec. 2011.

Ru et. al .A High-Linearity Digital-to-Time Converter Technique: Constant-Slope Charging. IEEE Journal of Solid-State Circuits vol. 50, No. 6, Jun. 2015.

* cited by examiner

DIGITAL-TO-TIME CONVERTER AND OPERATING METHOD THEREOF

CROSS-REFERENCE TO RELATED APPLICATION

This U.S. non-provisional application claims the benefit of priority under 35 U.S.C. § 119 to Korean Patent Application No. 10-2017-0033209, filed on Mar. 16, 2017, and Korean Patent Application No. 10-2017-0103208, filed on Aug. 14, 2017, both filed in the Korean Intellectual Property Office (KIPO), the entire disclosures of both applications are incorporated herein in their entirety by reference.

BACKGROUND

Various example embodiments of the inventive concepts relate to a digital-to-time converter, and more particularly, to a digital-to-time converter and/or a method of operating the digital-to-time converter.

A digital-to-time converter (DTC) controls the amount of a time delay (e.g., a delay period) according to and/or based on a received digital code. The DTC may be used to implement a sampling oscilloscope, a Fractional-N phase-locked loop (PLL), and/or a time interleaved analog-to-digital converter (ADC). The DTC provided in the Fractional-N PLL may mitigate the nonlinearity of a time-to-digital converter (TDC). Meanwhile, the nonlinearity of the DTC restricts the improvement of the accuracy or other characteristics of a semiconductor device in which the DTC is provided.

SUMMARY

Various example embodiments of the inventive concepts provide a digital-to-time converter (DTC) with high linearity.

According to an aspect of at least one example embodiment of the inventive concepts, there is provided a DTC including: a digital-to-analog converter (DAC) configured to generate a precharge voltage corresponding to a value of a digital code; a ramp generator including a first switching circuit configured to provide a first current path between a first node connected to a capacitor and a second node connected to a current source, and a second switching circuit configured to provide a second current path from a power supply voltage source to the second node, the ramp generator configured to precharge the capacitor connected to the first node based on the precharge voltage, and charge or discharge the capacitor based on a reference current provided from the current source in response to a transition of an input clock signal to generate a ramp voltage in the first node; and a comparator configured to generate an output clock signal based on the ramp voltage.

According to another aspect of at least one example embodiment of the inventive concepts, there is provided a DTC including: a first delay cell configured to generate a first clock signal based on at least one upper bit of a digital code, the first clock signal causing a delay of an input clock signal by a first delay amount, a second delay cell configured to generate a second clock signal based on at least one lower bit of the digital code, the second clock signal causing delay of the first clock signal by a second delay amount, wherein the first delay cell comprises a first digital-to-analog converter configured to generate a precharge voltage corresponding to a value of the at least one upper bit, a first ramp voltage generator configured to generate a first ramp voltage whose voltage level changes from a voltage level of the precharge voltage to a first slope based on the precharge voltage, and output the first ramp voltage through a first output node, and a first comparator configured to generate the first clock signal based on a voltage level of the first ramp voltage and a voltage level of a first reference voltage.

According to another aspect of at least one example embodiment of the inventive concepts, there is provided a method of operating a DTC including: generating, by a first delay cell, a first clock signal which causes a delay of an input clock signal by a first delay amount based on at least one upper bit of a digital code, and generating, by a second delay cell, a second clock signal which causes a delay of the first clock signal by a second delay amount based on at least one lower bit of the digital code, wherein the generating of the first clock signal comprises precharging a first load capacitor provided in the first delay cell based on a precharge voltage corresponding to a value of the at least one upper bit, setting a voltage level of a second node connected to a first current source such that the first current source generates a reference current, and discharging a constant current based on the reference current from the first load capacitor.

BRIEF DESCRIPTION OF THE DRAWINGS

Various example embodiments of the inventive concepts will be more clearly understood from the following detailed description taken in conjunction with the accompanying drawings in which.

DETAILED DESCRIPTION

Hereinafter, various example embodiments of the inventive concepts will be described in detail with reference to the accompanying drawings.

Figure 1:
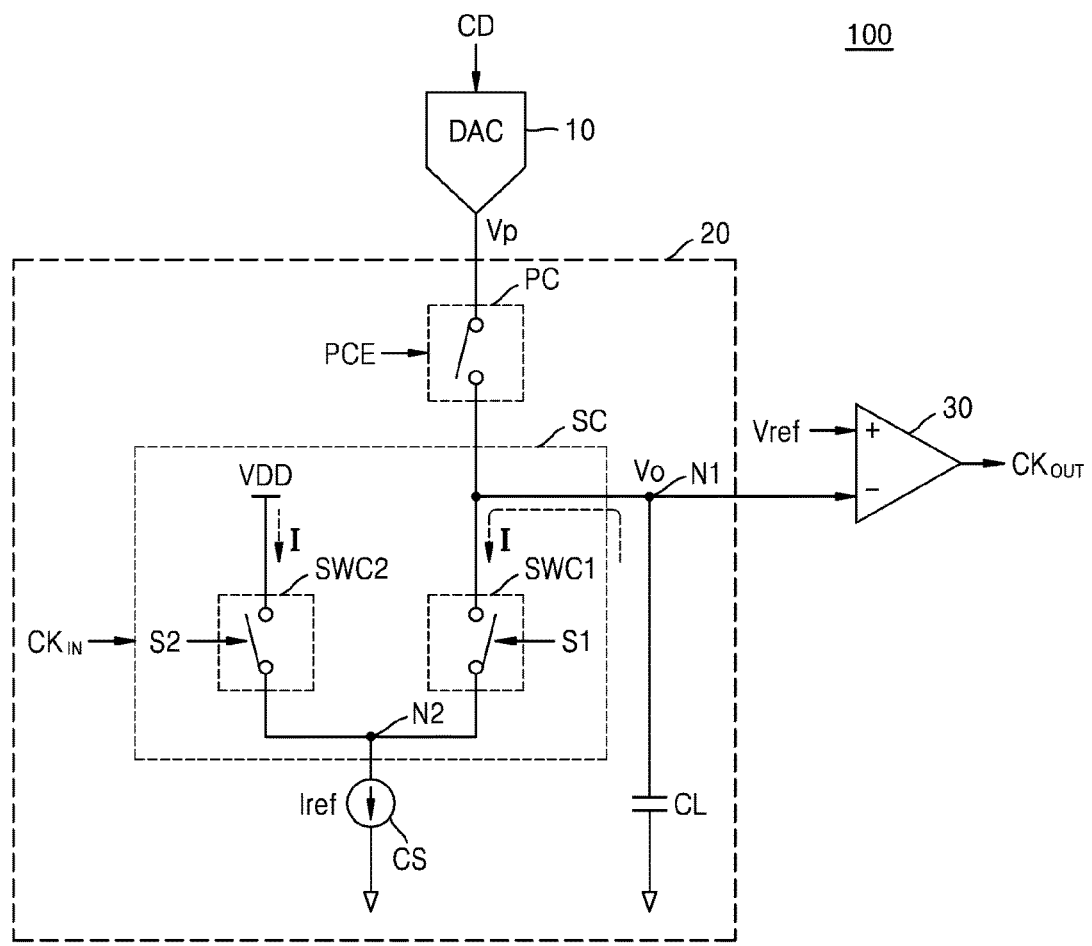
FIG. 1 is a block diagram of a digital-to-time converter (DTC) according to at least one example embodiment of the inventive concepts.

FIG. 1 is a block diagram of a digital-to-time converter (DTC) 100 according to at least one example embodiment of the inventive concepts.

Referring to FIG. 1, the DTC 100 may include a digital-to-analog converter (DAC) 10, a ramp generator 20, and/or a comparator 30, but is not limited thereto. The DTC of FIG. 1 may be referred to as a DTC delay cell, or as a single-stage DTC. The DAC 10, the ramp generator 20, and the comparator 30 may constitute one delay cell. However, the inventive concepts are not limited thereto, and in at least one example embodiment, the DTC 100 may include a plurality of delay cells, or in other words, a plurality of DACs, ramp generators, and/or comparators.

The DAC 10 may convert a received digital code CD into an analog signal. The DAC 10 may generate a precharge voltage Vp whose level varies according to and/or based on a value of the digital code CD and outputs the precharge voltage Vp based on the digital code CD. For example, the DAC 10 may include an R-2R DAC. The DAC 10 may include a ladder network including resistive elements having a resistance value R or a resistance value 2*R, and may output a voltage corresponding to bits of the digital code CD applied to the resistive elements. However, the inventive concepts are not limited thereto, and the DAC 10 may include various kinds of DAC circuits that output a voltage whose level varies according to a value of the digital code CD.

The ramp generator 20 may generate an output voltage Vo whose voltage level changes from a level of the precharge voltage Vp with a desired and/or predetermined slope as time elapses based on the precharge voltage Vp. The output voltage Vo may be referred to as a ramp signal.

The ramp generator 20 may include a precharge circuit PC, a load capacitor CL, a switching circuit SC, and/or a current source CS, but is not limited thereto.

The precharge circuit PC is turned on in response to receiving a precharge enable signal PCE, and may supply the precharge voltage Vp to the load capacitor CL. In other words, when the precharge circuit PC is turned on by the precharge enable signal PCE, the DAC 10 may charge the load capacitor CL based on the precharge voltage Vp. A voltage level of a first node N1 to which the load capacitor CL is connected may rise to the level (e.g., the voltage level) of the precharge voltage Vp as the load capacitor CL is charged based on the precharge voltage Vp. The first node N1 is an output node of the ramp generator 20. Therefore, a level of the output voltage Vo of the ramp generator 20 may rise to the level of the precharge voltage Vp.

The current source CS may generate a reference current Iref. A constant current and/or a desired current, such as a current that is one half of the reference current Iref, may be discharged from the load capacitor CL based on the reference current Iref provided from the current source CS, or may be charged in the load capacitor CL.

The switching circuit SC may form a current path between the load capacitor CL and the current source CS based on an input clock signal $CK_{IN}$. In other words, the switching circuit SC may form a current path between the first node N1 to which the load capacitor CL is connected and a second node N2 to which the current source CS is connected.

The switching circuit SC may include a first switching circuit SWC1 and a second switching circuit SWC2, but the example embodiments are not limited thereto. Components and structures of the first switching circuit SWC1 and the second switching circuit SWC2 may be substantially the same. The first switching circuit SWC1 may be connected between the first node N1 and the second node N2. The second switching circuit SWC2 may be connected between a power supply voltage VDD and the second node N2. The connection of the power supply voltage VDD to a circuit or element in the inventive concepts means that the circuit or element may be connected a power supply voltage source that provides the power supply voltage VDD, and the power supply voltage VDD is applied to one end of the circuit or element.

The first switching circuit SWC1 is turned on in response to receiving a first switching signal S1, and the first switching circuit SWC1 may provide a current path between the first node N1 and the second node N2 when turned on. The second switching circuit SWC2 is turned on in response to receiving a second switching signal S2, and the second switching circuit SWC2 may provide a current path from the power supply voltage VDD to the second node N2 when turned on. The first switching signal S1 and the second switching signal S2 may be signals based on the input clock signal $CK_{IN}$.

In at least one example embodiment, the second switching signal S2 may be the input clock signal $CK_{IN}$, and the first switching signal S1 may be a delay clock signal delaying the input clock signal $CK_{IN}$. Therefore, the second switching circuit SWC2 may be turned on prior to the first switching circuit SWC1 being turned on, in order to set a voltage level of the second node N2 so that the current source CS may operate normally. Thereafter, the first switching circuit SWC1 is turned on to form a current path between the first node N1 and the second node N2.

In another example embodiment, the first switching signal S1 and the second switching signal S2 may be the same signal based on the input clock signal $CK_{IN}$. For example, the first switching signal S1 and the second switching signal S2 may be the same as the input clock signal $CK_{IN}$.

Meanwhile, as described above, the second switching circuit SWC2 may have substantially the same structure as that of the first switching circuit SWC1. Therefore, when both the first switching circuit SWC1 and the second switching circuit SWC2 are turned on, a constant current (and/or desired current) I which is one half of the reference current Iref may flow through the first switching circuit SWC1 and the second switching circuit SWC2. However, the example embodiments are not limited thereto and, for example, the constant current I may be any other desired current based on the reference current Iref (e.g., a current equal to and/or lower than the reference current Iref).

The constant current I may be discharged from the load capacitor CL through the first switching circuit SWC1, or may be charged to the load capacitor CL. Accordingly, the level of the output voltage Vo may drop or rise at a constant rate from the level of the precharge voltage Vp.

FIG. 1 shows that the current source CS is connected between the second node N2 and a ground voltage. Accordingly, when the first switching circuit SWC1 is turned on, a constant current based on the reference current Iref may be discharged from the load capacitor CL. Therefore, the level of the output voltage Vo may drop at a constant rate from the level (e.g., voltage level) of the precharge voltage Vp. However, the example embodiments of the inventive concepts are not limited thereto. In at least one example embodiment, the current source CS may be connected between the second node N2 and the power supply voltage VDD, wherein the second switching circuit SWC2 may be connected between the second node N2 and the ground voltage. Accordingly, when the first switching circuit SWC1 is turned on, a constant current based on the reference current Iref may be charged in the load capacitor CL and the level (e.g., voltage level) of the output voltage Vo may rise from the level (e.g., voltage level) of the precharge voltage Vp at a constant rate.

The comparator 30 may generate an output clock signal $CLK_{DTC}$ of the DTC 100 based on the level of the output voltage Vo output from the first node N1. In at least one example embodiment, the comparator 30 may be implemented as an inverter, but is not limited thereto. In at least one example embodiment, the comparator 30 may be implemented as a differential amplifier as illustrated in FIG. 1, and may compare a level of a reference voltage Vref received at one end of the differential amplifier with the level of the output voltage Vo input to the other end of the differential amplifier and generate a result of the comparison as the output clock signal $CLK_{DTC}$. According to at least one example embodiments, the reference voltage Vref may be set to be equal to or lower than the lowest level of the precharge voltage Vp, but is not limited thereto. In at least one example embodiment, the reference voltage Vref may be set to be equal to or less than a half of the power supply voltage VDD, but is not limited thereto. As the reference voltage Vref is set low, a dynamic range of the precharge voltage Vp may be enlarged.

Meanwhile, as described above, when the level of the output voltage Vo rises from the level of the precharge voltage Vp at a constant rate, the reference voltage Vref may be set to be equal to or higher than the highest level of the precharge voltage Vp. In at least one example embodiment, the reference voltage Vref may be set to be half or more of the power supply voltage VDD, but is not limited thereto.

Hereinafter, operations of the DTC 100 will be described in detail with reference to FIG. 2.

Figure 2:
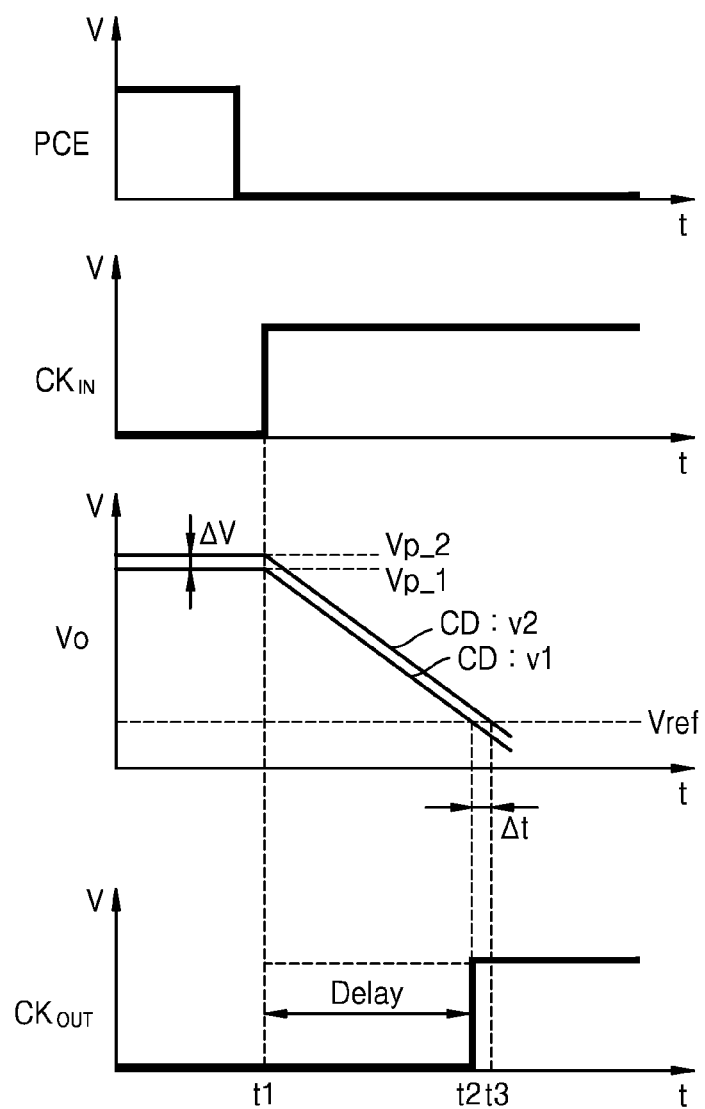
FIG. 2 is a timing diagram of the DTC of FIG. 1 according to at least one example embodiment.

FIG. 2 is a timing diagram of the DTC 100 of FIG. 1 according to at least one example embodiment.

Referring to FIGS. 1 and 2, after the precharge enable signal PCE transitions from a first level, e.g., logic high, to a second level, e.g., logic low, the input clock signal $CK_{IN}$ may transition from logic low to logic high. A period in which the precharge enable signal PCE is logic high may be referred to as a precharge period, and a period after the input clock signal $CK_{IN}$ has transitioned may be referred to as an evaluation period.

The level of the output voltage Vo of the first node N1 may be set to the level of the precharge voltage Vp as the load capacitor CL is precharged based on the precharge voltage Vp in the precharge period. For example, the level of the output voltage Vo when a value of the digital code CD is v1 may be set to Vp_1, but the example embodiments are not limited thereto. If v2 is greater than v1, the level of the output voltage Vo may be set to Vp_2 when the value of the digital code CD is v2, and Vp_2 may be higher than Vp_1, but the example embodiments are not limited thereto.

After the precharge period, when the input clock signal $CK_{IN}$ transitions at a time t1, the level of the output voltage Vo may drop at a constant rate. In at least one example embodiment, if the first switching signal S1 is a delay clock signal that delays the input clock signal $CK_{IN}$, the level of the output voltage Vo may drop after a desired and/or predetermined delay time (e.g., delay period, delay period of time, etc.) elapses from the time t1.

The comparator 30 may output logic low when the level of the output voltage Vo is higher than the level of the reference voltage Vref, and may output logic high when the level of the output voltage Vo is lower than the level of the reference voltage Vref. For example, when a value of the digital code CD is v1, the comparator 30 may output logic high at a time t2 when the level of the output voltage Vo is equal to the level of the reference voltage Vref. Thus, an output clock signal CKOUT may transition from logic low to logic high at the time t2. Accordingly, the DTC 100 may output the output clock signal CKOUT in which the input clock signal $CK_{IN}$ is delayed by a delay amount set according to and/or based on the digital code CD that was input to the DTC 100.

When a value of the digital code CD is v2, the output clock signal CKOUT may transition from logic low to logic high at a time t3, and if a difference between the code values of v1 and v2 is 1 (for example, v1 is '0010' and v2 is '0011'), Δt, which is a time interval between the time t2 and the time t3, may be a unit delay amount (or a minimum delay resolution) of the DTC 100. The unit delay amount Δt may be defined by Equation 1.

$$\Delta t = (\Delta Vo \times CL)/I \quad \text{[Equation 1]}$$

where ΔVo is a unit variation of the precharge voltage Vp of the DAC 10 as a value of the digital code CD is increased or decreased.

As such, the DTC 100 according to at least one example embodiment of the inventive concepts varies the level of the precharge voltage Vp according to (e.g., based on) the value of the digital code CD so as to vary a ramp start level of the output voltage Vo and decrease (or increase) the output voltage Vo at a constant rate.

Figure 3A:
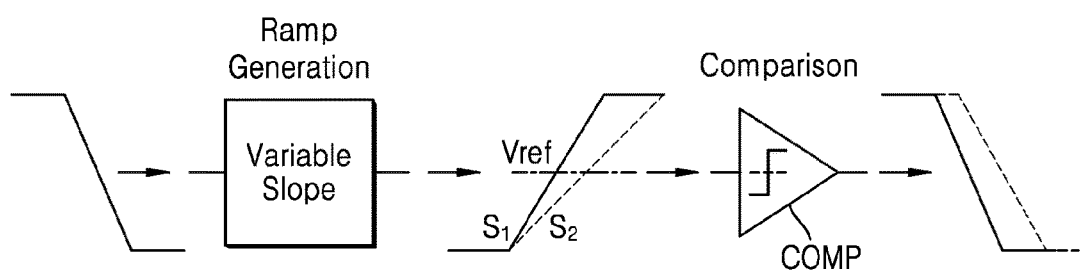
FIGS. 3A to 3B are views of examples of a ramp voltage according to a digital code in a DTC according to some example embodiments.
Figure 3B:
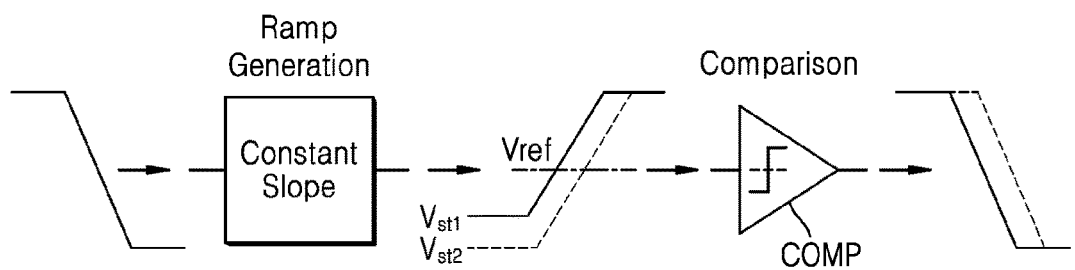

FIG. 3A and FIG. 3B are views of ramp voltages according to a digital code in a DTC according to some example embodiments.

Referring to FIG. 3A, a ramp generator (e.g., a linear ramp generator) may generate ramp voltages whose start levels are the same as each other and whose slopes vary according to the digital code. For example, a slope of the ramp voltage may be set to S1, S2, or the like, according to and/or based on the digital code. Referring to FIG. 3B, a ramp generator (e.g., the ramp generator 20 of the DTC 100 in FIG. 1) may generate a ramp voltage whose start levels are variable and whose slope is constant according to and/or based on the digital code. For example, the start levels of the ramp voltage may be set to Vst1, Vst2, or the like according to and/or based on the digital code.

A comparator COMP may compare the ramp voltage with the reference voltage Vref (or a threshold voltage if the comparator COMP is implemented as an inverter) and may output a result of the comparison. Accordingly, the comparator COMP may output an output voltage whose delay amount (e.g., delay time, delay period, etc.) varies according to and/or based on the digital code.

Meanwhile, the output of the comparator COMP may also have a slope due to a delay element in the comparator COMP, and a delay amount may vary depending on the slope of the ramp voltage to be input. As illustrated in FIG. 3A, the slope of the output of the comparator COMP may also be variable when the slope of the ramp voltage is variable. Meanwhile, when a ramp voltage having a constant rate is applied to the comparator COMP as illustrated in FIG. 3B, the slope of the output of the comparator COMP may be constant even if the start levels of the ramp voltage are different from each other. Therefore, the linearity of a DTC using a ramp voltage with a constant rate may be increased. The DTC 100 according to at least one example embodiment of the inventive concepts varies the ramp start levels of the output voltage Vo according to a value of the digital code CD and maintains the output voltage Vo at a constant rate so that the linearity may be increased.

Figure 4:
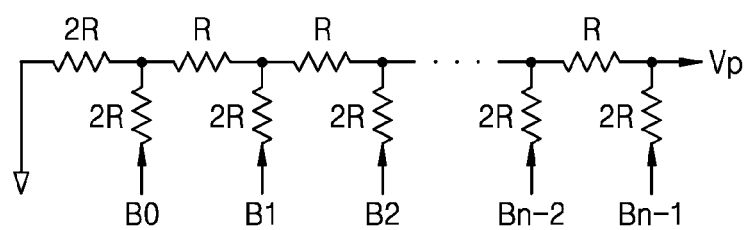
FIG. 4 is a circuit diagram showing at least one example embodiment of a digital-to-analog converter (DAC) of FIG. 1.

FIG. 4 is a circuit diagram showing the DAC 10 of FIG. 1 according to at least one example embodiment.

Referring to FIG. 4, a DAC 10a may be implemented as an R-2R DAC (e.g., digital-to-analog convertor). The DAC 10a may include a ladder network (e.g., a resistor ladder network) including a plurality of first resistors R and a plurality of second resistors 2R. A resistance value of each of the first resistors R is R, and a resistance value of each of the second resistors 2R is 2*R.

A ground voltage for each of bits B0 to Bn−1 of a digital code may be applied to one end of each of the second resistors 2R. The level (e.g., voltage level) of the precharge voltage Vp may vary according to a value of the digital code. Meanwhile, as described with reference to FIGS. 1 and 2, the DAC 10a may precharge the load capacitor CL during a precharge period. The DAC 10a including the R-2R ladder network may precharge the load capacitor CL with a time constant of R*CL, and a precharge time of the load capacitor CL may be relatively short.

Figure 5:
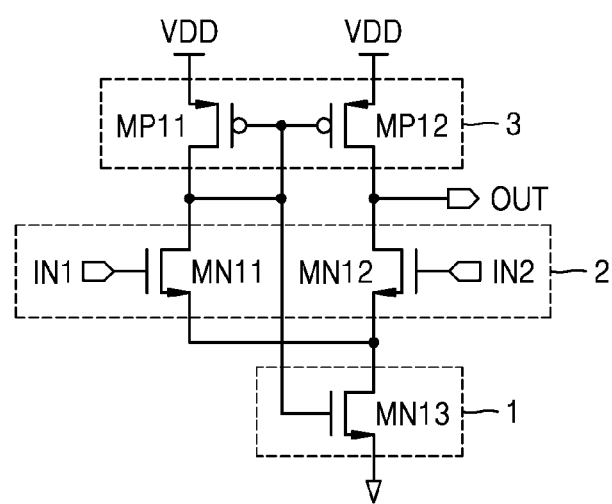
FIG. 5 is a circuit diagram showing at least one example embodiment of a comparator of FIG. 1.

FIG. 5 is a circuit diagram showing the comparator 30 of FIG. 1 according to at least one example embodiment.

Referring to FIG. 5, a comparator 30a may be implemented as a differential amplifier. The comparator 30a may include a current source 1, an input terminal 2, and/or a load terminal 3, but is not limited thereto.

The load terminal 3 may include PMOS transistors MP11 and MP12, and each source of MP11 and MP12 may be connected to the power supply voltage VDD. The input terminal 2 may include NMOS transistors MN11 and MN12. The reference voltage Vref (e.g., the Vref of FIG. 1, etc.) may be applied to a gate of MN11 through a first input terminal IN1, and the output voltage Vo may be applied to a gate of MN12 through a second input terminal IN2. A drain of MN11 may be connected to a source and gate of MP1 and a drain of MN12 may be connected to a drain and output terminal OUT of MP12.

Meanwhile, the gates of the transistors MP11 and MP12 may be connected to each other and may also be connected to a gate of an NMOS transistor MN13 provided in the current source 1. As a result, a bias voltage may be applied to the current source 1.

An example embodiment of the comparator 30a has been described with reference to FIG. 5. However, the example embodiments of the inventive concepts are not limited thereto and the comparator 30a may be implemented with various types of differential amplifiers.

Figure 6A:
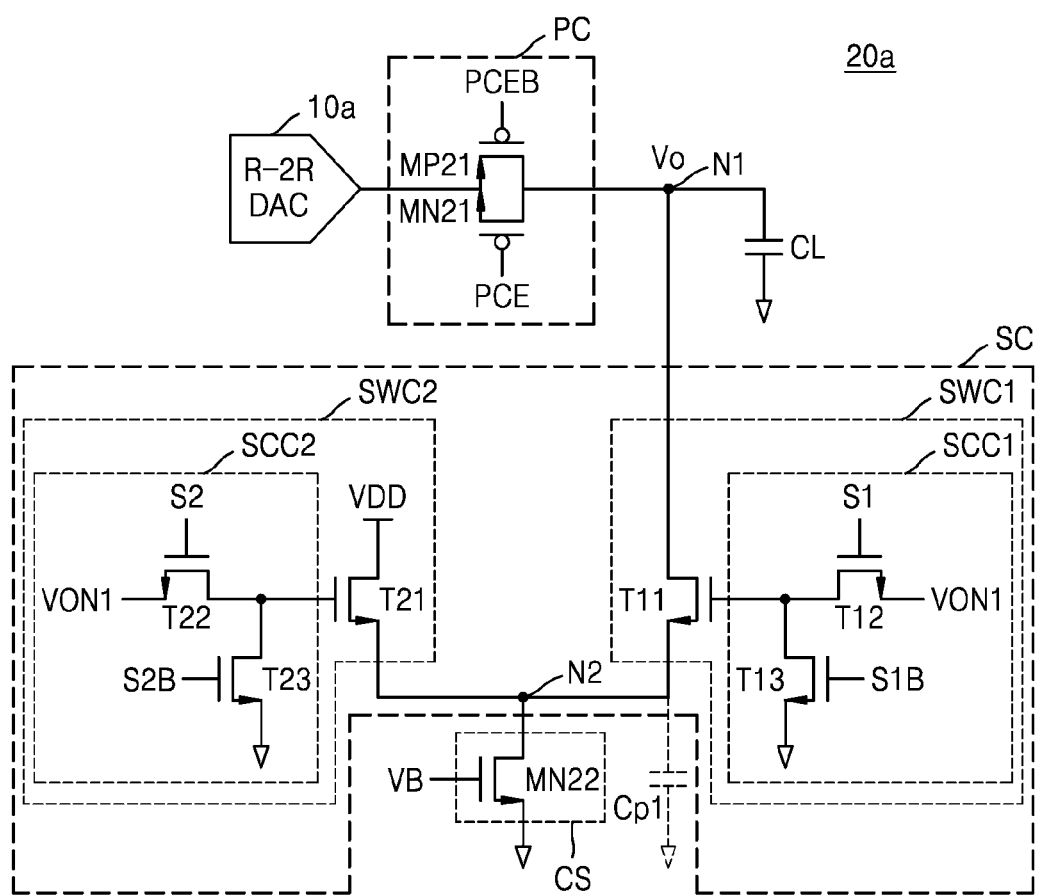
FIG. 6A is a circuit diagram showing a ramp generator according to at least one example embodiment of the inventive concepts.
Figure 6B:
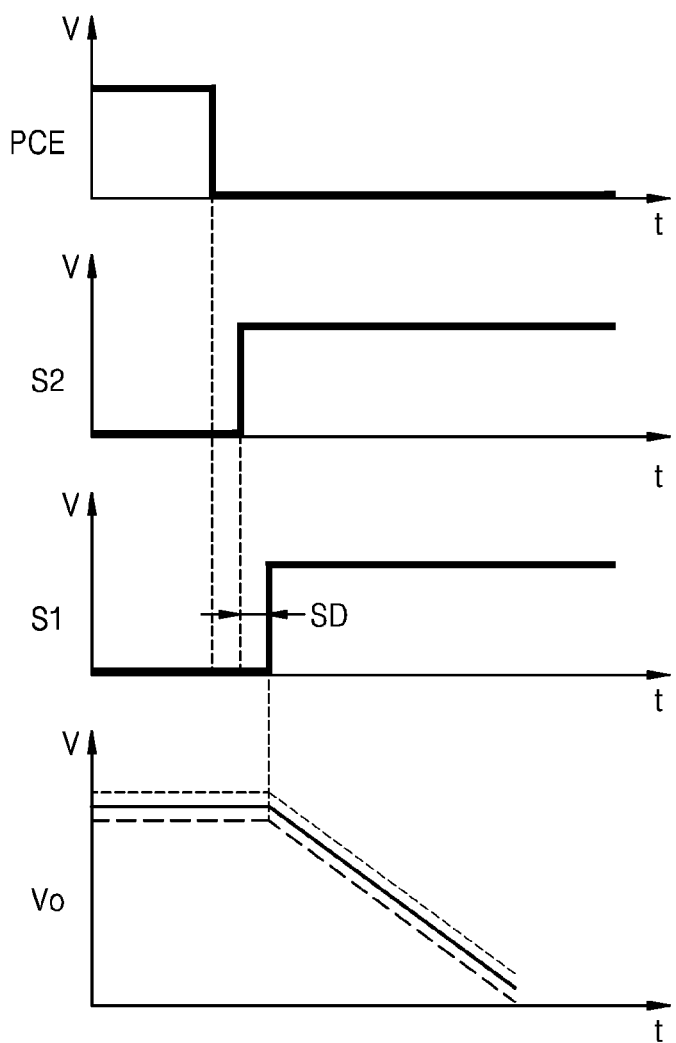
FIG. 6B is a timing diagram of the ramp generator of FIG. 6A according to at least one example embodiment.

FIG. 6A is a circuit diagram showing a ramp generator 20a according to at least one example embodiment of the inventive concepts, and FIG. 6B is a timing diagram of the ramp generator 20a of FIG. 6A according to at least one example embodiment. The ramp generator 20a of FIG. 6A is an example embodiment of the ramp generator 20 of FIG. 1. Therefore, the descriptions with reference to FIG. 1 may be applied to the present example embodiment.

Referring to FIG. 6A, the ramp generator 20a may include the precharge circuit PC, the load capacitor CL, the current source CS, and/or the switching circuit SC, but is not limited thereto.

The precharge circuit PC may be implemented as a switch in which the NMOS transistor MN21 and the PMOS transistor MN21 are connected to each other in parallel. The precharge circuit PC may be turned on in response to the receiving of the precharge enable signal PCE. For example, as illustrated in FIG. 6B, the precharge circuit PC is turned on in a precharge period in which the precharge enable signal PCE is logic high, so that an output of the DAC 10a may be connected to the load capacitor CL. The DAC 10a may precharge the load capacitor CL based on the precharge voltage Vp whose level is determined according to and/or based on a code value. A level (e.g., voltage level) of the output voltage Vo may be set to a level of the precharge voltage Vp. Since the level of the precharge voltage Vp varies according to a digital code value, the level of the output voltage Vo may vary according to and/or based on the digital code value.

The switching circuit SC may include the first switching circuit SWC1 and the second switching circuit SWC2. As shown in FIG. 6A, the first switching circuit SWC1 and the second switching circuit SWC2 may have a symmetrical structure, but is not limited thereto. The first switching circuit SWC1 may operate in response to the first switching signal S1, and the second switching circuit SWC2 may operate in response to the second switching signal S2. As described above with reference to FIG. 1, the first switching signal S1 and the second switching signal S2 may be signals based on the input clock signal $CK_{IN}$. In at least one example embodiment, the second switching signal S2 may be the input clock signal $CK_{IN}$, and the first switching signal S1 may be a delay clock signal which delays the input clock signal $CK_{IN}$.

The first switching circuit SWC1 may include the NMOS transistor T11 and a first switching control circuit SCC1, which is a switching transistor, and the second switching circuit SWC2 may include the NMOS transistor T11 and a second switching control circuit SCC2, which is a switching transistor. The transistor T11 may be connected between the first node N1 and the second node N2, and one end of the transistor T21 may be connected to the second node N2 and the power supply voltage VDD may be applied to the other end of the transistor T21. The lengths and widths of the transistors T11 and T21 may be the same, but is not limited thereto.

The first switching control circuit SCC1 may include NMOS transistors T12 and T13, and the second switching control circuit SCC2 may include NMOS transistors T22 and T23. Components and a structure of the second switching control circuit SCC2 may be substantially the same as those of the first switching control circuit SCC1, but is not limited thereto.

The first switching control circuit SCC1 may provide a first turn-on voltage VON1 to the transistor T11 in response to the first switching signal S1 (e.g., in response to receiving the first switching signal S1). The transistor T13 may turn off the transistor T11 in response to a second switching bar signal S1B (e.g., in response to receiving the second switching signal S1B), which is a complementary signal of the first switching signal S1, when the first switching signal S1 is logic low. Thereafter, when the first switching signal S1 transitions to a logic high, the transistor T12 may apply the first turn-on voltage VON1 to the transistor T11 in response to the first switching signal S1. In at least one example embodiment, a level of the first turn-on voltage VON1 may be lower than a logic high level of the first switching signal S1. The transistor T11 is turned on in response to the first turn-on voltage VON1, and may operate in a saturation region of the transistor.

Since operations of the second switching control circuit SCC2 are similar to those of the first switching control circuit SCC1, repeated descriptions thereof will not be given herein. However, the second switching control circuit SCC2 operates in response to the second switching signal S2.

The first switching signal S1 may be a delay signal of the second switching signal S2. Therefore, as illustrated in FIG. 6B, a transition point in time of the second switch signal S2 from logic low to logic high may be faster than a transition point in time of the first switch signal S1 from logic low to logic high. The transistor T21 is turned on prior to when the transistor T11 is turned on so that a voltage level of the second node N2 may be set to a level at which the current source CS may operate normally. Thereafter, when the transistor T11 is also turned on, a constant current and/or desired current may flow through the transistors T11 and T21. A time interval SD between the transition point in time of the second switching signal S2 and the transition point in time of the first switching signal S1, that is, a delay amount (e.g., delay time, delay period, etc.) of the first switching signal S1 may be set in consideration of a setting time up to a point in time at which the current source CS may operate normally after the second switching signal S2 transitions.

As the transistors T11 and T21 operate in the saturation region, the second node N2 may maintain a constant voltage level regardless of the level of the output voltage Vo, and the second node N2 may be in a virtual grounded state in an alternate current (AC) characteristic.

The current source CS may include the NMOS transistor MN12. A bias voltage VB may be applied to the transistor MN12. The second node N2 may be in a grounded state before the transistor T21 is turned on. When the transistor T21 is turned on, the voltage level of the second node N2 increases, and the current source CS may operate normally before the transistor T11 is turned on. Thereafter, when the transistor T11 is turned on, the current source CS may generate a constant (e.g., desired) reference current Iref. Accordingly, a constant current based on the reference current Iref may be discharged from the load capacitor CL. Therefore, as shown in FIG. 6B, the level of the output voltage Vo may drop from a point in time where the second switching signal S2 transitions at a constant slope.

Also, unlike the switching circuit SC according to the example embodiment of the inventive concepts shown in FIG. 6A, when the switching circuit SC includes only the first switching circuit SWC1 except for the second switching circuit SWC2, the second node N2 is discharged at a ground level when the transistor T11 is turned off, and the voltage level of the second node N2 may rise when the transistor T11 is turned on. Therefore, since a drain-source voltage difference of the transistor MN12 is variable, the current source CS cannot generate a constant current.

Furthermore, as illustrated in FIG. 6A, a parasitic capacitance Cp1 may be formed in the second node N2 and may reduce a charge amount of the load capacitor CL due to a charge sharing effect. Further, the amount of reduction may vary depending on a level of the output voltage Vo. As such, when the switching circuit SC includes only the first switching circuit SWC1, the ramp generator may include nonlinear parameters. Therefore, the linearity of the DTC may be degraded.

However, in the ramp generator 20a according to at least one example embodiment of the inventive concepts, the switching circuit SC operates based on the first switching circuit SWC1 and the second switching circuit SWC2 having a symmetrical structure, and the circuit SWC2 may be set so that the current source CS may operate normally before the transistor T11 is turned on. In addition, since the second switching circuit SWC2 can provide a charge to the parasitic capacitance Cp1, charge sharing between the load capacitor CL and the parasitic capacitance Cp1 may be reduced and/or prevented. Thus linearity of the DTC (100 in FIG. 1) according to at least one example embodiment of the inventive concepts may be improved.

Figure 7:
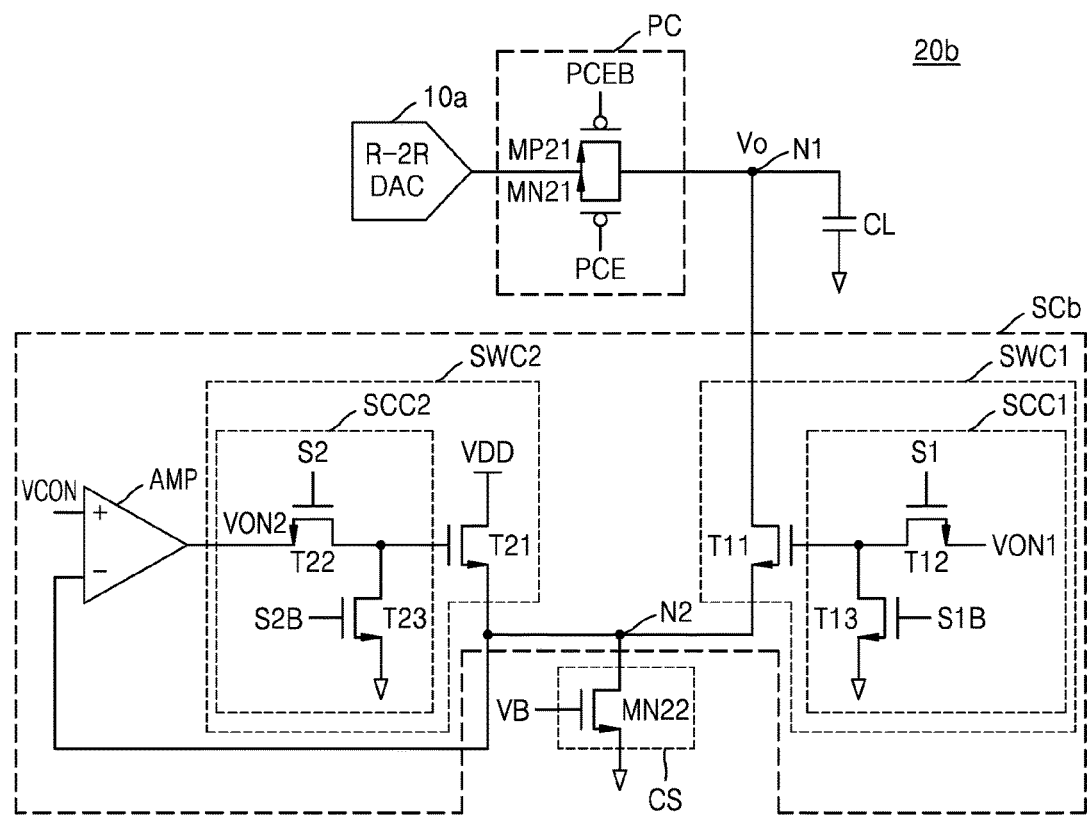
FIG. 7 is a circuit diagram showing a ramp generator, according to at least one example embodiment of the inventive concepts.

FIG. 7 is a circuit diagram showing an embodiment of the ramp generator 20b, according to at least one example embodiment of the inventive concepts. The ramp generator 20b of FIG. 7 is an example embodiment of the ramp generator 20 of FIG. 1. Therefore, the descriptions with reference to FIG. 1 may be applied to the present example embodiment.

Referring to FIG. 7, the ramp generator 20b may include the precharge circuit PC, the load capacitor CL, the current source CS, and/or a switching circuit SCb, but is not limited thereto.

The ramp generator 20b of FIG. 7 is comparable to the ramp generator 20a of FIG. 6, and the ramp generator 20b of FIG. 7 may further include an amplifier AMP. Since structures and operations of the other components are similar to those of the components in FIG. 6, repeated descriptions thereof will not be given herein.

The amplifier AMP may amplify a voltage difference between a received control voltage VCON and the second node N2, and the amplifier AMP may output the amplified voltage difference as a second turn-on voltage VON2. The second switching circuit SCC2 may provide the second turn-on voltage VON2 to the transistor T21. The transistor T21 may form a current path based on the second turn-on voltage VON2. Thus, the amplifier AMP may adjust a voltage level of the second node N2 based on the control voltage VCON and a voltage level of a second node N2. Therefore, a feedback loop is formed, whereby the voltage level of the second node N2 may be set to a level of the control voltage VCON.

When the transistor MN22 of the current source CS is a long channel element, the current source CS has finite output impedance. The load connected to the first switching circuit SWC1 and the load connected to the second switching circuit SWC2 may be different from each other. Therefore, the first switching circuit SWC1 and the second switching circuit SWC2 are not completely differential even if the first switching circuit SWC1 and the second switching circuit SWC2 have the same components and structure, and the second node N2 may not be in a virtual grounded state in an AC characteristic. However, since the amplifier AMP keeps a drain-source voltage of the transistor MN22 constant, the reference current Iref generated in the current source CS may be maintained constant even if a load condition through the transistor T11 is different from a load condition through the transistor T21.

Figure 8:
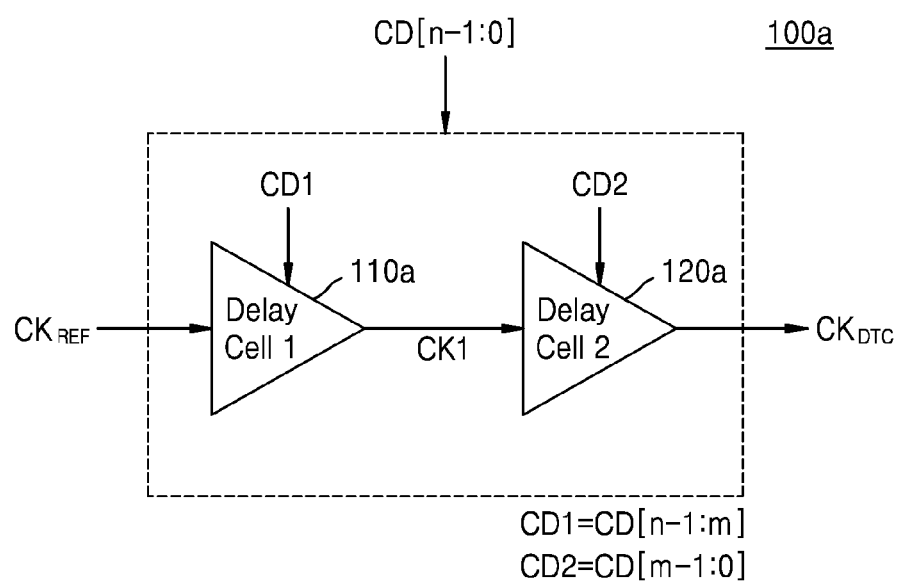
FIG. 8 is a block diagram of a DTC according to at least one example embodiment of the inventive concepts.
Figure 9A:
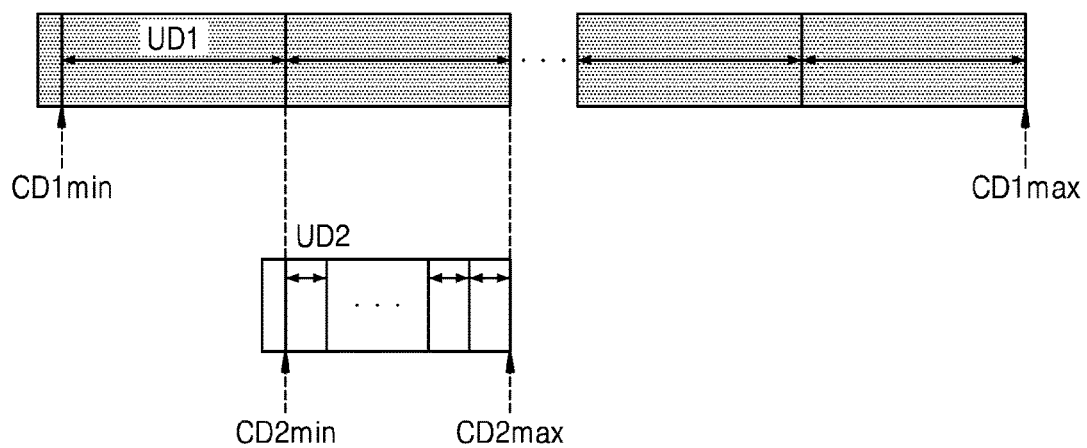
FIGS. 9A and 9B are views for explaining a pipeline operation of the DTC in FIG. 8 according to some example embodiments.
Figure 9B:
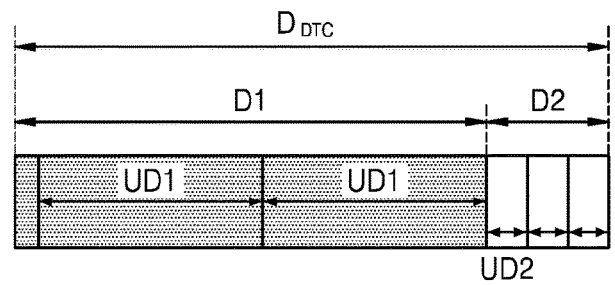

FIG. 8 is a block diagram of a DTC 100a according to at least one example embodiment of the inventive concepts. FIGS. 9A and 9B are views for explaining a pipeline operation of the DTC 100a in FIG. 8 according to some example embodiments.

Referring to FIG. 8, the DTC 100a may include a plurality of delay cells, such as a first delay cell 110a and a second delay cell 120a, etc. The DTC 100a is a cascade type multi-stage DTC, but the example embodiments are not limited thereto.

The DTC 100a may generate an output clock signal $CK_{DTC}$ in which the input clock signal $CK_{IN}$ is delayed by a delay amount (e.g., delay time, delay period, etc.) corresponding to a value of a digital code CD [n-1:0] based on an n-bit digital code CD [n-1:0].

The n-bit digital code CD [n-1:0] may be divided into a first digital code CD1 including an upper-bit digital code CD [n-1:m] and a second digital code CD2 including a lower-bit digital code CD [m-1:0] (where m is an integer equal to greater than 1, and n is an integer greater than m).

The first delay cell 110a may generate a first clock signal CK1 delaying the input clock signal $CK_{IN}$ by a first delay amount (e.g., delay time, delay period, etc.) based on the first digital code CD1. The second delay cell 120a may generate the output clock signal $CK_{DTC}$ delaying the first clock signal CK1 by a second delay amount (e.g., delay time, delay period, etc.) based on the second digital code CD2.

The first delay cell 110a may be implemented as a DTC delay cell according to some example embodiments of the inventive concepts described with reference to FIGS. 1 to 7. The second delay cell 120a may be implemented with a same or different type of delay cell as the first delay cell 110a.

Meanwhile, each of the first delay cell 110a and the second delay cell 120a may have a resolution corresponding to at least one of n bits of the digital code CD [n-1:0] through a pipeline operation. The resolution of the first delay cell 110a may correspond to upper n-m bits from among the n bits of the digital code CD [n-1:0], and the resolution of the second delay cell 120a may correspond to lower m bits from among the n bits of the digital code CD [n-1:0].

Referring to FIG. 9A, a delay amount of the first delay cell 110a may be based on and/or correspond to the first digital code CD1, that is, the first delay amount may have a discrete value from a minimum delay amount (e.g., a lower delay threshold value) CD1min to a maximum delay amount (e.g., an upper delay threshold value) CD1max. The first delay amount may be increased by a unit delay amount UD1 of the first delay cell 110a as a value of the first digital code CD1 increases by one.

The delay amount of the first delay cell 110a according to the second digital code CD2, that is, the second delay amount may have a discrete value from a minimum delay amount (e.g., a lower delay threshold value) CD2min to a maximum delay amount (e.g., an upper delay threshold value) CD2max. The second delay amount may be increased by a unit delay amount UD2 of the second delay cell 120a as a value of the second digital code CD2 increases by one.

Meanwhile, since the first digital code CD1 includes upper bits than those of the second digital code CD2, a difference between the second minimum delay amount CD2min and the second maximum delay amount CD2max of the second delay cell 120a may be equal to or smaller than the unit delay amount UD1 of the first delay cell 110a. The first delay cell 110a may be referred to as a coarse delay cell and the second delay cell 120a may be referred to as a fine delay cell. In other words, the plurality of delay cells may each be configured to support a different delay amount.

As illustrated in FIG. 9B, the first delay cell 110a of a total delay amount $D_{DTC}$ of the DTC 100a corresponding to the upper n-m bits of the digital code CD [n-1:0] may provide a first delay amount D1 in a wide range corresponding to the upper n-m bits, and the second delay cell 120a may provide a second delay amount D2 in a narrow range corresponding to the lower m bits. However, the example embodiments are not limited thereto and the first delay amount may be a narrower range than the second delay amount, etc.

The first delay cell 110a may output the first clock signal CK1 delaying the input clock signal $CK_{IN}$ by the first delay amount D1, and the second delay cell 120a may output the output clock signal $CK_{DTC}$ delaying the first clock signal CK1 by the second delay amount D2. Accordingly, the output clock signal $CK_{DTC}$ delaying the input clock signal $CK_{IN}$ by the total delay amount $D_{DTC}$ may be output.

When a DTC covers a wide range and the resolution is high, if the DTC is implemented in one stage, a unit variation Vo of a precharge voltage output from an internal DAC (for example, 10 in FIG. 1) may be less and/or very less. Accordingly, the nonlinearity of the DAC greatly effects the deterioration of the linearity of the DTC, and a delay characteristic of the DTC may be sensitively changed depending on a manufacturing process, a power supply voltage, the operating temperature, etc.

However, as illustrated in FIG. 8, as the DTC 100a is implemented in a cascade structure, the unit variation ΔVo of the precharge voltage of each delay cell may be set to a relatively large period. In addition, the DTC 100a may broaden the entire coverage with a small number of delay cells because the delay cells with different cover ranges are arranged to perform a pipeline operation. If all coverage of the DTC is identical, the number of delay cells of the DTC 100a may be less than the number of delay cells with the same coverage of the DTC. The number of delay cells in the DTC 100a may then be reduced, so that the consumption current and the circuit area of the DTC may be reduced.

Meanwhile, FIG. 8 shows a case where the DTC 100a includes two delay cells, that is, the first delay cell 110a and the second delay cell 120a. However, the example embodiments of the inventive concepts are not limited thereto, and the DTC 100a may include three or more delay cells, and the three or more delay cells may perform a pipeline operation.

Figure 10:
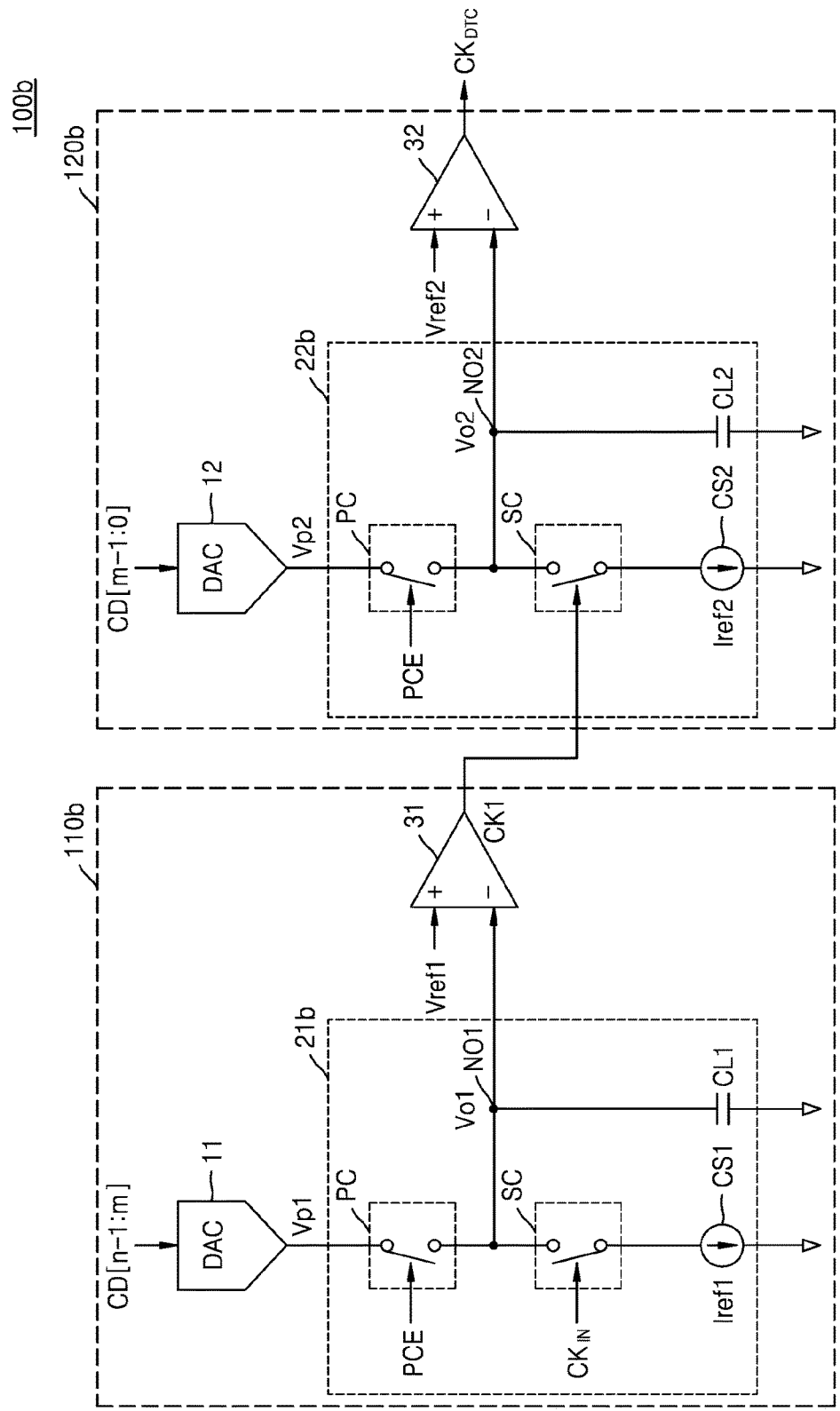
FIG. 10 is a circuit diagram showing at least one example embodiment of the DTC in FIG. 8.

FIG. 10 is a circuit diagram showing the DTC including two delay cells in FIG. 8 according to at least one example embodiment.

Referring to FIG. 10, a first delay cell 110b and a second delay cell 120b may be the same kind of delay cell having the same structure, but the example embodiments are not limited thereto. The first delay cell 110b and the second delay cell 120b may be implemented as the DTC delay cell according to some example embodiments of the inventive concepts described with reference to FIGS. 1 to 7. Although the switching circuit SC is shown schematically in FIG. 10, as described with reference to FIGS. 1 to 7, the switching circuit SC may include the first switching circuit SWC1 and the second switching circuit SWC2, etc.

A first reference voltage Vref1 and a second reference voltage Vref2 may be the same or different from each other. In at least one example embodiment, the first reference voltage Vref1 may be set based on at least one of a resolution of a first DAC, a level of a power supply voltage, and the number of bits of the applied digital code CD [n-1:m], that is, n-m. The second reference voltage Vref2 may be set based on at least one of a resolution of a second reference voltage Vref2, a level of a power supply voltage, and the number of bits of the applied digital code CD [m-1:0], that is, m.

In at least one example embodiment, capacitance of a second reference current Iref2 and a second load capacitor CL2 may be set based on capacitance of a first reference current Iref1 and a first load capacitor CL1, respectively.

For example, if upper four bits of the digital code CD are applied to the first delay cell 110b and the lower four bits of the digital code CD are applied to the second delay cell 120b, a unit delay amount of the second delay cell 120b may correspond to, for example, 1/16 times a unit delay amount of the first delay cell 110b, but the example embodiments are not limited thereto. Accordingly, a slope of an output voltage Vo2 of a ramp generator 22b in the second delay cell 120b may correspond to 16 times a slope of an output voltage Vo1 of a ramp generator 21b in the first delay cell 110b.

Referring to Equation 1, the slope of the output voltage Vo2 is proportional to the second reference current Iref2 and inversely proportional to the capacity of the second load capacitor CL2. Therefore, the amount of current of the second reference current Iref2 may be set to, for example, four times the amount of current of the first reference current Iref1, and the capacitance of the second load capacitor CL2 may be set to, for example, 1/4 times the capacitance of the first load capacitor CL1. However, the example embodiments of the inventive concepts are not limited thereto, and any current and corresponding capacitance amount may be used. The capacitance of the second reference current Iref2 and the capacitance of the second load capacitor CL2 may be variously set based on the first reference current Iref1 and a ratio of the capacitance and the slope of the first load capacitor CL1.

Figure 11:
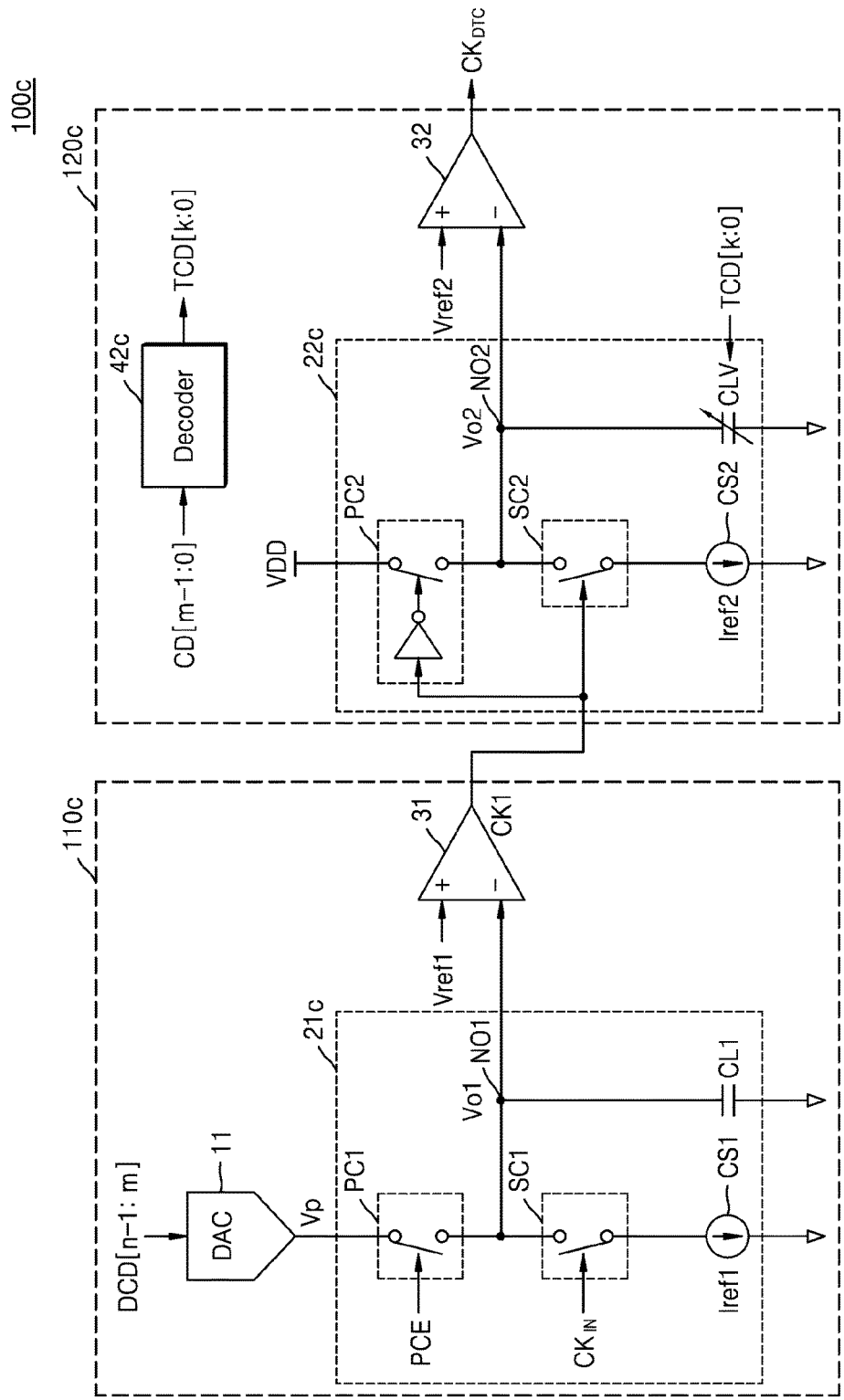
FIG. 11 is a circuit diagram showing at least one example embodiment of the DTC in FIG. 8.

FIG. 11 is a circuit diagram showing the DTC in FIG. 8 according to at least one example embodiment.

Referring to FIG. 11, a first delay cell 110c and a second delay cell 120c may be different kinds of delay cells having different structures. As shown in FIG. 11, the first delay cell 110c may be implemented as the DTC delay cell according to one or more example embodiments of the inventive concepts described with reference to FIGS. 1 to 7. Therefore, repeated descriptions of the first delay cell 110b will not be given here.

The second delay cell 120c may include a decoder 42c, a ramp generator 22c, and/or a comparator 32, but is not limited thereto. Compared to the first delay cell 110c, the second delay cell 120c does not include the DAC and the structure of the ramp generator 22c may be different from that of a ramp generator 21c of the first delay cell 110c.

The ramp generator 22c of the second delay cell 120c may include a precharge circuit PC2, a variable load capacitor CLV, a current source CS2, and/or a switching circuit SC2, but is not limited thereto. The decoder 42c may generate a thermometer code TCD [k:0] based on lower bits CD [m-1:0] of a received digital code. If the number of the lower bits CD [m-1: 0] of the digital code is m, a thermometer code TCD [k:0] including $2^m-1$ bits may be generated. For example, if m is 4, k may be 14. The variable load capacitor CLV may vary according to the thermometer code TCD [k:0].

The precharge circuit PC2 and the switching circuit SC2 may operate in response to a received clock signal, e.g., the first clock signal CK1. The precharge circuit PC2 and the switching circuit SC2 may operate complementarily and/or in cooperation with each other. The precharge circuit PC2 may be connected to an output node NO2 and may be turned on when the first clock signal CK1 is logic low. When the precharge circuit PC2 is turned on, the variable load capacitor CLV may be precharged to the power supply voltage VDD. Therefore, a voltage level of the output node NO2, that is, a level of the output voltage Vo2 may rise to a voltage level of the power supply voltage VDD. Thereafter, the switching circuit SC2 may be turned on when the first clock signal CK1 is logic high. When the switching circuit SC2 is turned on, the second current source CS2 may discharge the second reference current Iref2 from the precharged variable load capacitor CLV. Thus, the level of the output voltage Vo2 may be reduced from the voltage level of the power supply voltage VDD.

In the second delay cell 120c, capacitance of the variable load capacitor CLV may vary according to the value of the received digital code, and the current discharged from the variable load capacitor CLV may be kept constant. Referring to Equation 1, when capacitance of the variable load capacitor CLV is changed and the current is constant, a slope of the output voltage Vo2 may be changed.

Figure 12:
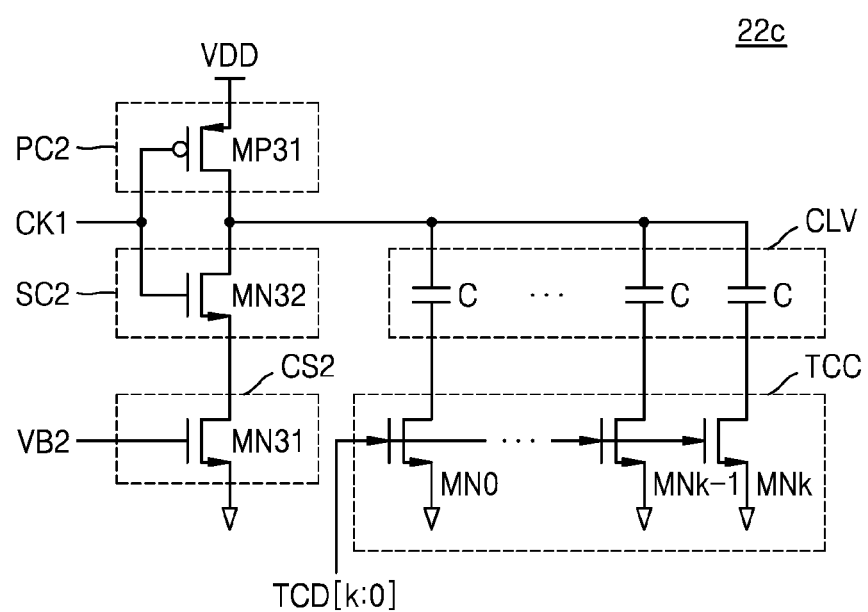
FIG. 12 is a circuit diagram showing at least one example embodiment of a ramp generator provided in a second delay cell of FIG. 11.

FIG. 12 is a circuit diagram showing a ramp generator 22c provided in the second delay cell 120c of FIG. 11 according to at least one example embodiment.

Referring to FIG. 12, the ramp generator 22c may include the precharge circuit PC2, the variable load capacitor CLV, the current source CS2, the switching circuit SC2, and/or a thermometer control circuit TCC, but is not limited thereto.

Referring to FIG. 12, the precharge circuit PC2 may include the PMOS transistor MP31. A drain of the transistor MP31 may be connected to the output node NO2, and the power source voltage VDD may be applied to a source of the transistor MP31. The transistor MP31 may be turned on when the first clock signal CK1 is logic low.

The switching circuit SC2 may include the NMOS transistor MN32. A drain of the transistor MN32 may be connected to the output node NO2 and a source of the transistor MN32 may be connected to the current source CS2. The transistor MP32 may be turned on when the first clock signal CK1 is logic high.

The current source CS2 may include the NMOS transistor MN31. A drain of the transistor MN31 may be connected to the switching circuit SC2, and a source of the transistor MN31 may be connected to a ground voltage. By applying a bias voltage VB2 to a gate of the transistor MN31, the transistor MN31 may generate the second reference current Iref2.

The variable load capacitor CLV may include a plurality of unit capacitors C connected to each other in parallel and the thermometer control circuit TCC may include transistors MN0 to MNk connected to each of the plurality of unit capacitors C. Each of the transistors MN0 to MNk may operate in response to each bit of the thermometer code TCD [k:0]. Each of the transistors MN0 to MNk may be turned on when the corresponding bit of the thermometer code TCD [k:0] is logic high to provide a ground voltage to the corresponding unit capacitor C. Therefore, capacity of the variable load capacitor CLV may be determined according to the number of bits that are logic high in the thermometer code TCD [k:0].

Referring again to FIG. 11, the second delay cell 120c maintains the start levels of a ramp voltage at a constant level and varies the slope of the ramp voltage according to (and/or based on) the value of a digital code as shown in FIG. 3A, and the delay amount may vary according to the value of the digital code. As described above with reference to FIG. 3A, when the slope of the ramp voltage is varied, the linearity of the second delay cell 120c may be lowered (e.g., reduced). However, since the second delay cell 120c is a fine delay cell, a variation of the capacitance of the variable load capacitor CLV is very small, and the nonlinearity due to the change of the slope is slight.

Meanwhile, as the capacitance of the variable load capacitor CLV changes, the second delay cell 120c may provide a small amount of unit delay based on the small amount of current of the second reference current Iref2. The size of transistors (for example, the transistors MP31, MN32, MNM31, etc. of FIG. 12) provided in the second delay cell 120c may be small because the current amount of the second reference current Iref2 is small. Therefore, the parasitic capacitance generated between the switching circuit SC2 and the current source CS2 may be very small and/or reduced in comparison to conventional delay cells and/or DTCs. In addition, since a precharge level of the output voltage Vo2 is fixed to the level of the power supply voltage VDD, the parasitic capacitance may also have a fixed value, instead of an less consistent, less reliable, and/or unpredictable value as compared to conventional delay cells and/or DTCs. Thus, the second delay cell 120c may have high linearity and/or higher linearity than conventional delay cells.

As described above with reference to FIG. 12, in a DTC 100c according to at least one example embodiment of the inventive concepts, the first delay cell 110c, which is a coarse delay cell, may be implemented as a delay cell in which the slope of the ramp voltage is constant regardless of the value of the received digital code and the switching circuit has a differential input structure, and the second delay cell 120c, which is a fine delay cell, may be implemented as a delay cell in which the slope of the ramp voltage is variable by changing the capacity of a load capacitor according to a value of the received digital code. As described above, the DTC 100c according to the present example embodiment may have improved linearity as the coarse delay cell and the fine delay cell have different characteristics, and the total circuit area of the DTC 100c may be reduced in comparison to conventional DTCs.

Figure 13:
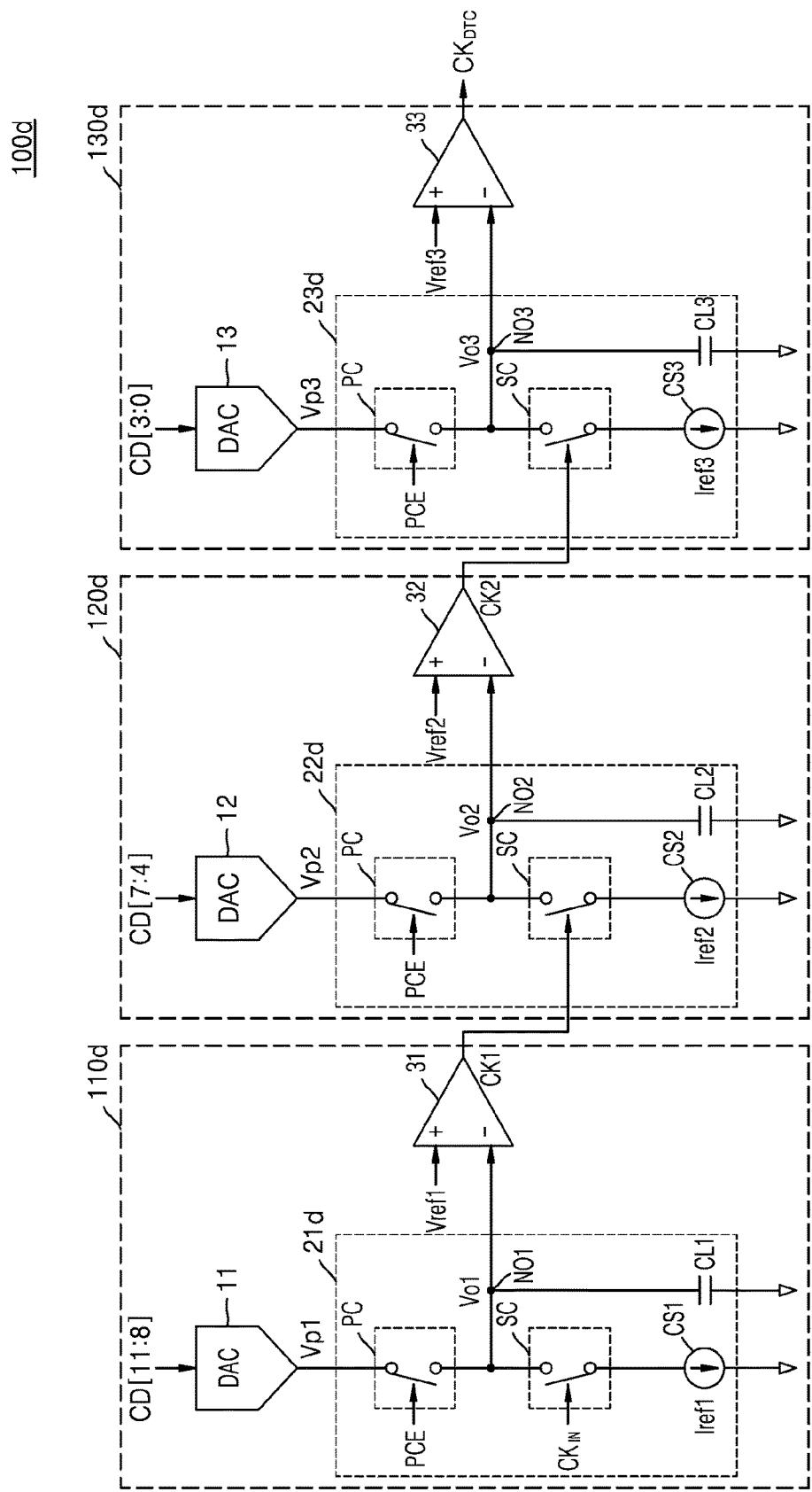
FIG. 13 is a circuit diagram showing a DTC according to at least one example embodiment of the inventive concepts.
Figure 14:
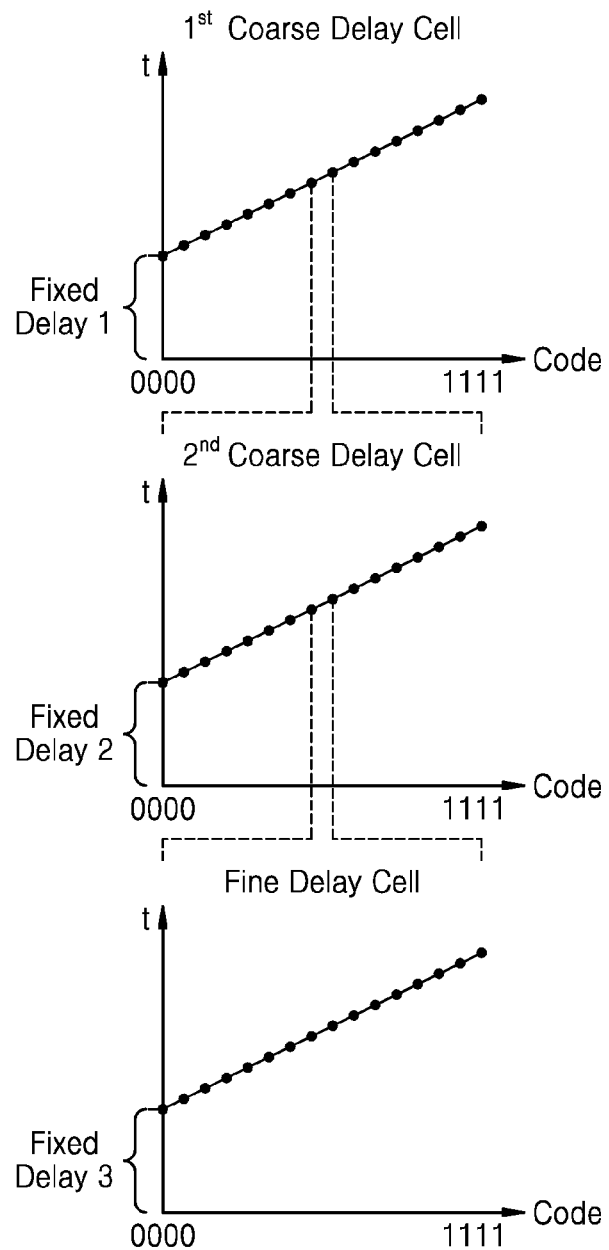
FIG. 14 is a graph of a delay amount according to a code value of each delay cell of the DTC in FIG. 13 according to at least one example embodiment.

FIG. 13 is a circuit diagram showing an embodiment of a DTC 100d, according to at least one example embodiment of the inventive concepts, and FIG. 14 is a graph of a delay amount according to a code value of each delay cell of the DTC 100d in FIG. 13 according to at least one example embodiment.

Referring to FIGS. 13 and 14, the DTC 100d may be a cascade type three-stage DTC, but the example embodiments are not limited thereto.

The DTC 100d may include a plurality of delay cells, such as a first delay cell 110d, a second delay cell 120d, and a third delay cell 130d, etc.

The first delay cell 110d, the second delay cell 120d, and the third delay cell 130d may be an identical type of delay cell having an identical structure. The first delay cell 110d, the second delay cell 120d, and the third delay cell 130d may be implemented as delay cells based on the DTC according to one or more of the example embodiments of the inventive concepts described with reference to FIGS. 1 to 7. In other words, the first delay cell 110d, the second delay cell 120d, and the third delay cell 130d may be implemented as a delay cell in which a slope of a ramp voltage is constant regardless of a value of a received digital code and a switching circuit has a differential input structure.

Each of the delay cells may output respective clock signals delaying a clock signal by a desired delay amount based on the bit values of the digital code CD. For example, the first delay cell 110d may output the first clock signal CK1 delaying the input clock signal $CK_{IN}$ by a first delay amount based on upper four bits CD [11:8] of a 12-bit digital code CD, the second delay cell 120d may output a second clock signal CK2 delaying the first clock signal CK1 by a second delay amount based on middle four bits CD [7:4] of the digital code CD, and the third delay cell 130d may output the output clock signal $CK_{DTC}$ delaying the input clock signal $CK_{IN}$ by a third delay amount based on lower four bits CD [3:0] of the digital code CD, etc.

Referring to FIG. 14, the plurality of delay cells, such as the first delay cell 110d, the second delay cell 120d, and the third delay cell 130d, may have a fixed (e.g., desired) delay amount (i.e., a delay amount when the code is '0000') and the delay amount may be linearly increased according to the code value. A unit delay amount of the first delay cell 110d may be equal to a difference between a minimum (e.g., lower desired) delay amount and a maximum (e.g., higher desired) delay amount of the second delay cell 120d and a unit delay amount of the second delay cell 120d may be equal to a difference between a minimum delay amount and a maximum delay amount of the third delay cell 130d. Accordingly, the first delay cell 110d, the second delay cell 120d, and the third delay cell 130d may perform a pipeline operation. The first delay cell 110d may be a first coarse delay cell, the second delay cell 120d may be a second coarse delay cell, and the third delay cell 130d may be a fine delay cell. In at least one example embodiment, the capacitance capacity of a load capacitor is variable in the third delay cell 130d according to a value of the received digital code described with reference to FIGS. 11 and 12, so that a delay cell in which the slope of the ramp voltage is variable may be applied.

Figure 15:
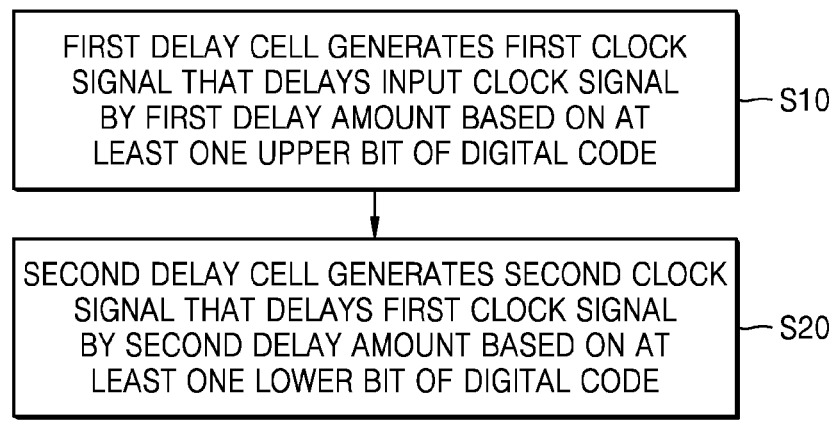
FIG. 15 is a flowchart of a method of operating a DTC according to at least one example embodiment of the inventive concepts.

FIG. 15 is a flowchart of a method of operating a DTC, according to at least one example embodiment of the inventive concepts.

FIG. 15 shows a method of operating the DTC including at least two delay cells.

First, in operation S10, a first delay cell may generate a first clock signal that delays an input clock signal by a first (e.g., desired) delay amount based on at least one bit of a digital code, for example at least one upper bit of a digital code.

Next, in operation S20, a second delay cell may generate a second clock signal that delays the first clock signal by a second (e.g., desired) delay amount based on at least one bit of the digital code, for example at least one lower bit of the digital code. Coverage of the second delay cell may be equal to or less than a unit delay of the first delay cell. Accordingly, the first delay cell and the second delay cell included in the DTC may perform a pipeline operation (e.g., pipeline delay operation) in response to at least one bit of a corresponding digital code.

Figure 16:
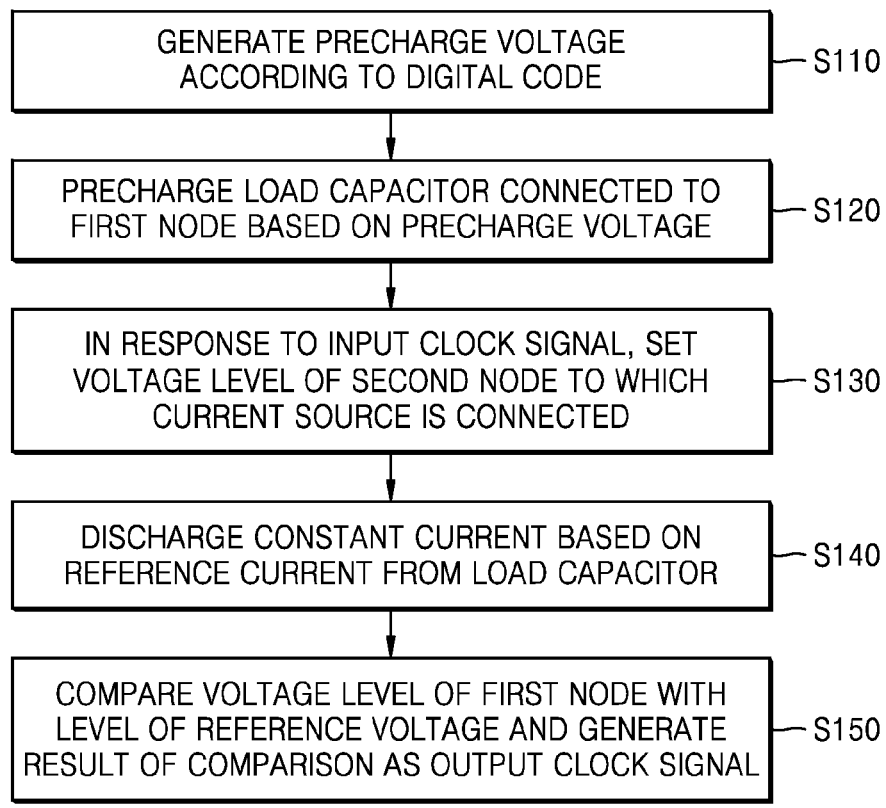
FIG. 16 is a flowchart of a method of operating a delay cell of a DTC according to at least one example embodiment.

FIG. 16 is a flowchart of a method of operating a delay cell of a DTC. The method of operating the delay cell of FIG. 16 may be applied to the operation S10 of FIG. 15, that is, the method of operating the coarse delay cell of the DTC in a cascade structure or the method of operating the DTC in a single-stage structure.

Referring to FIG. 16, in operation S110, the delay cell may generate a precharge voltage according to a digital code. For example, a DAC in the delay cell may generate a precharge voltage based on a digital code, and a level of the precharge voltage may vary according to a value of the digital code.

In operation S120, the delay cell may precharge a load capacitor connected to a first node based on the precharge voltage. The delay cell may precharge the load capacitor during a precharge period. As the load capacitor is precharged, a voltage level of the first node may be set to the voltage level of the precharge voltage.

In operation S130, in response to an input clock signal, the delay cell may set a voltage level of a second node to which a current source is connected. Thus, the current source may normally generate a reference current. In at least one example embodiment, the delay cell may set the voltage level of the second node to a desired and/or predetermined control voltage level.

Thereafter, in operation S140, the delay cell may discharge a constant (e.g., desired) current based on the reference current from the load capacitor. The current source may discharge a constant current based on the reference current from the load capacitor. Since the current source is set to normally generate the reference current in operation S130, the amount of current discharged from the load capacitor may be kept constant without being varied (e.g., without variation) in operation S140. The voltage level of the first node may be reduced at a constant rate.

In operation S150, the delay cell may compare the voltage level of the first node with a level of the reference voltage and may generate a result of the comparison as an output clock signal.

If the amount of current discharged from the load capacitor is not maintained constant, the linearity of the delay cell may be reduced. According to the method of operating the delay cell of the DTC of FIG. 16, the delay cell may improve the linearity of the DTC by setting the current source to normally generate the reference current before the current based on the reference current is discharged from the load capacitor.

Figure 17:
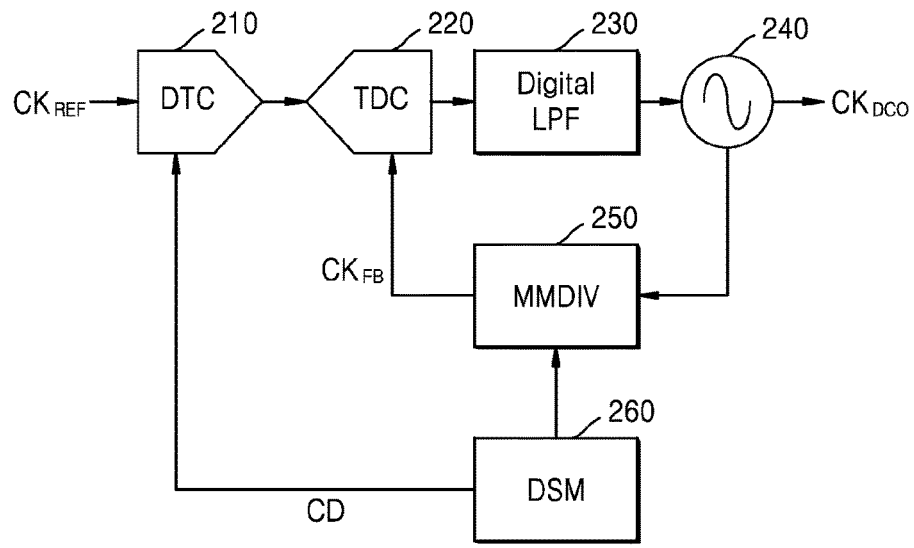
FIG. 17 is a block diagram of an all-digital phase-locked loop according to at least one example embodiment of the inventive concepts.

FIG. 17 is a block diagram of an all-digital phase-locked loop (hereinafter referred to as ADPLL) 200 according to at least one example embodiment of the inventive concepts.

Referring to FIG. 17, the ADPLL 200 may be a Fractional-N PLL. The ADPLL 200 may be applied to various kinds of circuits using an oscillation clock signal $CK_{DCO}$ synchronized with a reference clock signal $CK_{REF}$.

The ADPLL 200 may include a DTC 210, a time-to-digital converter 220 (hereinafter referred to as TDC), a digital low-pass filter 230, a digital voltage controlled oscillator 240 (hereinafter referred to as DVCO), a multi-modulus divider 250, and/or a delta-sigma modulator 260 (hereinafter referred to as DSM), but is not limited thereto.

The TDC 220 may compare a received clock signal with a feedback clock signal $CK_{FB}$, detect a phase and frequency difference, and output the difference as an up signal or a down signal. The digital low-pass filter 230 may filter a low-band signal among outputs from the TDC 220 by integrating the outputs from the TDC 220. The DVCO 240 may generate the oscillation clock signal $CK_{DCO}$ based on outputs from the digital low-pass filter 230.

The multi-modulus divider 250 may generate the feedback clock signal $CK_{FB}$ by dividing the oscillation clock signal $CK_{DCO}$ according to a set and/or desired division ratio. Meanwhile, a time-averaged division ratio of the ADPLL 200 may be set to a fraction, not an integer. The multi-modulus divider 250 divides the oscillation clock signal $CK_{DCO}$ by an integer division ratio, and divides the feedback clock signal $CK_{FB}$ according to an integer division ratio that may be changed every loop, so that the time-averaged division ratio set to the fraction may be satisfied. The multi-modulus divider 250 may divide the oscillation clock signal $CK_{DCO}$ according to an integer division ratio set under the control of the DSM 260 for each feedback loop.

As the integer division ratio changes over a unit time, the time-averaged division ratio may have a fractional value.

The DSM 260 may provide an integer division ratio to the multi-modulus divider 250. For example, when the multi-modulus divider 250 is set to divide the oscillation clock signal $CK_{DCO}$ by one of division ratios of N−2, N−1, N, N+1, and N+2, etc. (where N is an integer), the DSM 260 may randomly select the integer division ratios N−2, N−1, N, N+1, and N+2, etc. for each loop such that the time-averaged division ratio may have a desired value, and may provide the selected integer division ratio to the multi-modulus divider 250.

Meanwhile, in order for the TDC 220 to process a phase difference due to a change of an integer division ratio, a time-resolution and coverage of the TDC 220 need to be wide. Nonlinearity of the TDC 220 may be increased according to a loop operation, and an operating characteristic of the ADPLL 200 may deteriorate.

Accordingly, the ADPLL 200 according to at least one example embodiment of the inventive concepts may include the DTC 210, and the DTC 210 may compensate for the phase difference due to the change of the integer division ratio by delaying the reference clock signal $CK_{REF}$. The DTC 210 may provide the TDC 220 with a delay clock signal that is delayed from the reference clock signal $CK_{REF}$.

Here, the DSM 260 may generate the digital code CD reflecting the phase difference due to the change of the integer division ratio, and may provide the generated digital code CD to the DTC 210. The DTC 210 may delay and output the reference clock signal $CK_{REF}$ by a delay amount set according to the digital code CD provided from the DSM 260 for each loop to compensate for some of the phase difference due to the change of the integer division ratio.

One of DTCs according to the example embodiments of the inventive concepts described with reference to FIGS. 1 to 16 may be applied as the DTC 210 of the ADPLL 200. Since the linearity of the DTC 210 is high, the operating characteristic of the ADPLL 200 may be improved in comparison to conventional ADPLLs. For example, high linearity is desired in DTCs because it enables the DTCs to provide a more consistent and/or more reliable timed delay signal, whereas conventional DTCs provide a less consistent and/or less reliable timed delay signal due to parasitic capacitance issues.

Figure 18:
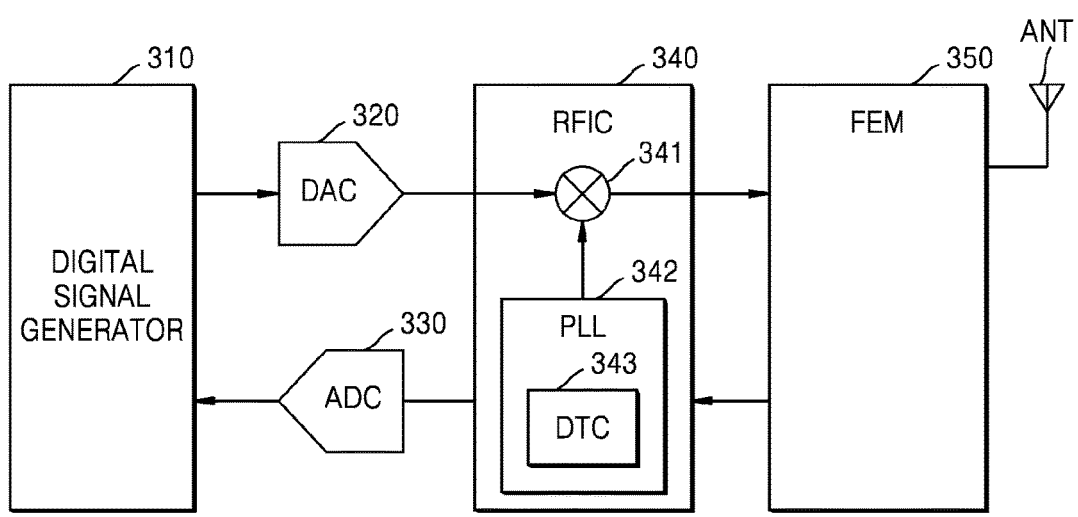
FIG. 18 is a block diagram of a wireless communication device according to at least one example embodiment of the inventive concepts.

FIG. 18 is a block diagram of a wireless communication device 300 according to at least one example embodiment of the inventive concepts.

The wireless communication device 300 may include a digital signal generator 310, a DAC 320, an analog-to-digital converter (ADC) 330, a radio frequency integrated circuit (RFIC) 340, a front end module 350, and/or antenna ANT, but the wireless communication device is not limited thereto.

The digital signal generator 310 (e.g., a digital signal processor, etc.) may process a signal including information to be transmitted or received according to a set communication method. For example, the digital signal generator 310 may process the signal according to a communication method such as Orthogonal Frequency Division Multiplexing (OFDM), Orthogonal Frequency Division Multiple Access (OFDMA), Wideband Code Multiple Access (WCDMA), or High Speed Packet Access+ (HSPA+), etc.

The DAC 320 may convert a digital signal including information to be transmitted into analog signal and provide the converted analog signal to the RFIC 340.

The ADC 330 may convert analog signal received from the RFIC 340 into a digital signal and provide the converted digital signal to the digital signal generator 310.

The RFIC 340 may up-convert a frequency of the baseband transmission signal received from the DAC 320 to generate an RF signal. In addition, a baseband signal may be generated by down-converting a frequency of the received RF signal. For the frequency conversion, the RFIC 340 may include a phase-locked loop (PLL) 342 and a mixer 341. The mixer 341 may up-convert a frequency of a transmission signal or down-convert a frequency of a reception signal based on a clock signal output from the PLL 342.

The PLL 342 may include one of DTCs according to one or more of the example embodiments of the inventive concepts described with reference to FIGS. 1 to 16. The PLL 342 applied in the wireless communication device 300 may generate frequency signals of various bands based on a reference clock signal. Thus, the PLL 342 may be a Fractional-N PLL and may include a DTC 343. For example, the ADPLL 200 of FIG. 17 may be applied to the PLL 342 and the DTC 343 may include one of DTCs according to one or more of the example embodiments of the inventive concepts described with reference to FIGS. 1 to 16.

The front end module 350 may include an amplifier, a duplexer, and the like. The front end module 350 may amplify an RF transmission signal provided from the RFIC 340 and transmit the amplified signal via the antenna ANT. In at least one example embodiment, the wireless communication device 300 may include a plurality of antennas ANT, and the front end module 350 may separate the RF transmission signal by frequency bands and provide them to the corresponding antennas ANT.

Meanwhile, although the present example embodiment shows that the DTC 343 is applied to the PLL 342 included in the RFIC 340, this is only an example. The DTC 343 may be applied to other components (e.g., phase modulators, frequency synthesizers, etc.) that use an oscillation clock signal generated based on a reference clock signal.

Figure 19:
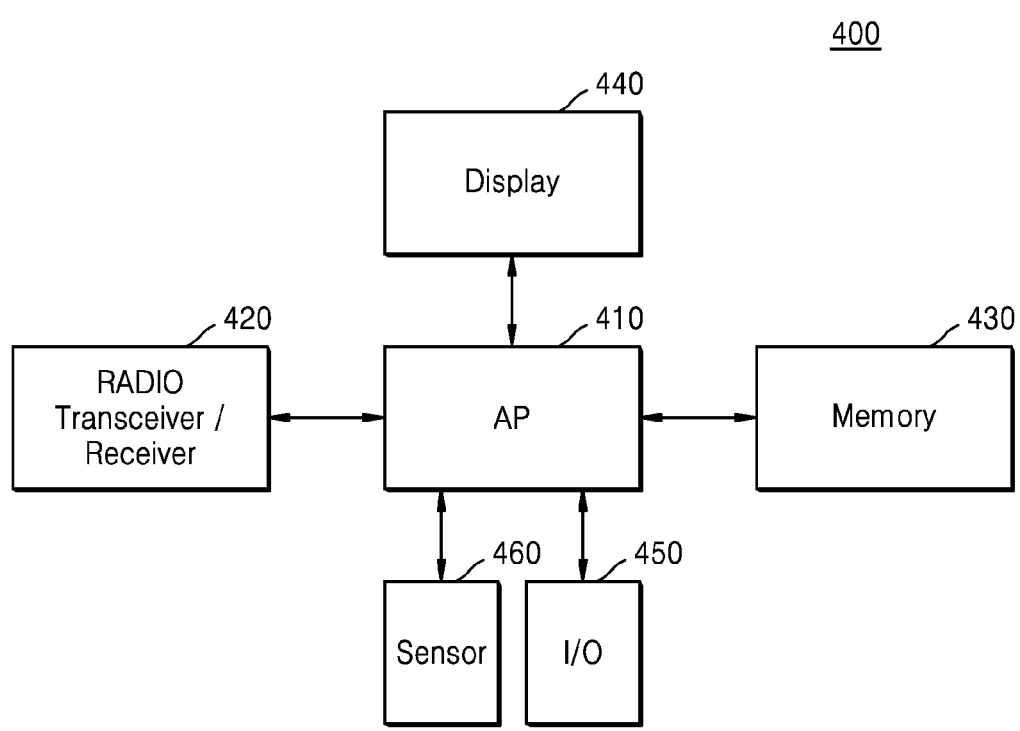
FIG. 19 is a block diagram showing an Internet of Things (IoT) device according to at least one example embodiment of the inventive concepts.

FIG. 19 is a block diagram showing an Internet of Things (IoT) device 400, according to at least one example embodiment of the inventive concepts.

Referring to FIG. 19, the IoT device 400 may include an application processor (AP) 410, a transceiver 420, a memory 430, a display 440, a sensor 460, and/or an input/output device 450, but is not limited thereto.

The IoT device 400 may include the transceiver 420 for communicating with the outside. For example, the transceiver 420 may be a wireless short-range communication interface such as a wired Local Area Network (LAN), a Bluetooth, a Wireless Fidelity (Wi-Fi), and Zigbee, or a modem communication interface connectable to a mobile cellular network such as a Power Line Communication (PLC) or 3rd Generation (3G), a Long Term Evolution (LTE), and the like. The transceiver 420 may include an ADPLL, such as the ADPLL 200 of FIG. 17, that includes DTCs according to one or more of the above-described example embodiments of the inventive concepts. Thus, a transmission/reception characteristic of the transceiver 420 may be improved, and a consumption current may be reduced.

The AP 410 may control general operations of the IOT device 400 and operations of components of the IoT device 400. The AP 410 may perform various operations. According to at least one example embodiment, the AP 410 may include one processor core (single core) or a plurality of processor cores (multi-core), a plurality of interconnected processors, etc., but is not limited thereto.

The sensor 460 may be, for example, an image sensor that senses an image. The sensor 460 may be connected to the AP 410 and may transmit the generated image to the AP 410. The sensor 460 may be a biosensor for sensing biometric information. The sensor 460 may be any sensor, such as an illuminance sensor, an acoustic sensor, an acceleration sensor, and the like.

The display 440 may display internal state information of the IoT device 400. Display 440 may include a touch sensor (not shown). Furthermore, the display 440 may also include an input or output functionality and appearance for a user interface. A user may control the IoT device 400 through the touch sensor and the user interface.

The input/output device 450 may include an input unit such as a touch pad, a keypad, an input button, and the like, and an output unit such as a display, a speaker, and the like.

The memory 430 may store a control command code, control data, or user data for controlling the IOT device 400. The memory 430 may include at least one of volatile memory and nonvolatile memory.

The IoT device 400 may include a battery for internal power supply or a power supply for receiving external power. The IoT device 400 may further include a storage device. The storage device may be a nonvolatile medium such as a hard disk (HDD), a Solid State Disk (SSD), an embedded Multi Media Card (eMMC), or a Universal Flash Storage (UFS). The storage device may store information of a user provided through the input/output device 450 and pieces of sensing information collected through the sensor 460.

The IoT device 400 requires low power consumption. A frequency synthesis circuit, e.g., a circuit that generates a range of frequencies from a single reference frequency, may be used in at least some of the components of the IoT device 400 described above, such as the AP 410, the transceiver 420, the memory 430, the display 440, the sensor 460, and/or the input/output device 450, wherein the frequency synthesis circuit may include DTCs according to one or more of the example embodiments of the inventive concepts. Accordingly, the linearity of the frequency synthesis circuit may be improved, and power consumption of the IoT device 400 may be reduced.

While various example embodiments of the inventive concepts has been particularly shown and described with reference to example embodiments thereof, it will be understood that various changes in form and details may be made therein without departing from the spirit and scope of the following claims.

What is claimed is:

1. A digital-to-time converter comprising:
   a digital-to-analog converter configured to generate a precharge voltage corresponding to a value of a digital code;
   a ramp generator including a first switching circuit configured to provide a first current path between a first node connected to a capacitor and a second node connected to a current source, and
   a second switching circuit configured to provide a second current path from a power supply voltage source to the second node,
   the ramp generator configured to,
   precharge the capacitor connected to the first node based on the precharge voltage, and
   charge or discharge the capacitor based on a reference current provided from the current source in response to a transition of an input clock signal to generate a ramp voltage in the first node; and a comparator configured to generate an output clock signal based on the ramp voltage.

2. The digital-to-time converter of claim 1, wherein
the digital-to-analog converter is further configured to vary start levels of the ramp voltage by varying the precharge voltage based on the value of the digital code; and
the ramp generator is further configured to maintain a constant slope of the ramp voltage.

3. The digital-to-time converter of claim 1, wherein the ramp generator is further configured to:
turn on the second switching circuit prior to the first switching circuit to set a voltage level of the second node such that the current source generates the reference current.

4. The digital-to-time converter of claim 1, wherein
the first switching circuit comprises a first transistor connected between the first node and the second node; and
the second switching circuit comprises a second transistor connected between the power supply voltage source and the second node.

5. The digital-to-time converter of claim 4, wherein
the first switching circuit further comprises a first switching control circuit configured to provide a first turn-on voltage to a gate of the first transistor in response to a delay clock signal which causes a delay of the input clock signal; and
the second switching circuit further comprises a second switching control circuit configured to provide the first turn-on voltage to a gate of the second transistor in response to the input clock signal.

6. The digital-to-time converter of claim 5, wherein
the second switching control circuit has the same structure as the first switching control circuit.

7. The digital-to-time converter of claim 6, wherein,
when the first transistor and the second transistor are turned on in response to the first turn-on voltage, the first transistor and the second transistor operate in a saturation region.

8. The digital-to-time converter of claim 4, wherein
the first switching circuit further comprises a first switching control circuit configured to provide a first turn-on voltage to a gate of the first transistor in response to a delay clock signal which causes delay of the input clock signal;
the second switching circuit further comprises a second switching control circuit configured to provide a second turn-on voltage to a gate of the second transistor in response to the input clock signal; and
the ramp generator further comprises an amplifier configured to,
amplify a difference between a voltage level of the second node and a voltage level of a control voltage, and
output the amplified difference as the second turn-on voltage such that the voltage level of the second node is equal to the voltage level of the control voltage.

9. The digital-to-time converter of claim 1, wherein
the DAC comprises an R-2R resistor ladder network.

10. The digital-to-time converter of claim 1, wherein
the digital code comprises a plurality of bits; and
the digital-to-analog converter is further configured to increase a voltage level of the precharge voltage based on an increase in values of the plurality of bits of the digital code.

11. A digital-to-time converter comprising:
a first delay cell configured to generate a first clock signal based on at least one upper bit of a digital code, the first clock signal causing a delay of an input clock signal by a first delay amount; and
a second delay cell configured to generate a second clock signal based on at least one lower bit of the digital code, the second clock signal causing delay of the first clock signal by a second delay amount, wherein
the first delay cell comprises,
a first digital-to-analog converter configured to generate a precharge voltage corresponding to a value of the at least one upper bit;
a first ramp voltage generator configured to,
generate a first ramp voltage whose voltage level changes from a voltage level of the precharge voltage to a first slope based on the precharge voltage, and
output the first ramp voltage through a first output node; and
a first comparator configured to
generate the first clock signal based on a voltage level of the first ramp voltage and a voltage level of a first reference voltage.

12. The digital-to-time converter of claim 11, wherein the second delay amount is based on a difference between a maximum delay amount and a minimum delay amount that is equal to a unit delay amount of the first delay cell.

13. The digital-to-time converter of claim 11, wherein the first ramp voltage generator comprises:
a precharge circuit configured to precharge a capacitor connected to the first output node based on the precharge voltage;
a current source configured to discharge a first reference current from the capacitor after the capacitor is precharged;
a first transistor connected between the first output node and a second node that is an input node of the current source and turned on in response to a delay clock signal which causes a delay of the input clock signal to provide a discharge path of the first reference current; and
a second transistor connected between a power supply voltage source and the second node and turned on in response to the input clock signal to set a voltage level of the second node before the first transistor is turned on.

14. The digital-to-time converter of claim 11, wherein the second delay cell comprises:
a second digital-to-analog converter configured to generate a second voltage based on the at least one lower bit;
a second ramp voltage generator configured to,
receive the first clock signal,
generate a second ramp voltage whose voltage level changes from a level of the second voltage to a second slope based on the second voltage, and
output the second ramp voltage through a second output node; and
a second comparator configured to generate the second clock signal based on a voltage level of the second ramp voltage and a level of a second reference voltage.

15. The digital-to-time converter of claim 14, wherein the second slope is greater than the first slope.

16. The digital-to-time converter of claim 11, wherein second delay cell comprises:

a second ramp generator configured to generate a second ramp voltage whose level is reduced from a level of a power supply voltage source when the first clock signal transitions, wherein the second ramp generator comprises,
- a variable capacitor configured to store variable capacitance corresponding to a thermometer code according to the least one lower bit;
- a current source configured to discharge a second reference current from the variable capacitor; and
- a switching circuit configured to,
    - precharge the variable capacitor based on the power supply voltage source if the first clock signal is at a first level, and
    - connect the variable capacitor and the current source when the first clock signal transitions from the first level to a second level.

17. A digital phase-locked loop circuit comprising the digital-to-time converter of claim 11.

18. A method of operating a digital-to-time converter, the method comprising:
- generating, by a first delay cell, a first clock signal which causes a delay of an input clock signal by a first delay amount based on at least one upper bit of a digital code; and
- generating, by a second delay cell, a second clock signal which causes a delay of the first clock signal by a second delay amount based on at least one lower bit of the digital code, wherein the generating of the first clock signal comprises,
- precharging a first load capacitor provided in the first delay cell based on a precharge voltage corresponding to a value of the at least one upper bit,
- setting a voltage level of a second node connected to a first current source such that the first current source generates a reference current, and
- discharging a constant current based on the reference current from the first load capacitor.

19. The method of claim 18, wherein the setting of the voltage level of the second node comprises turning on a switch connected to the second node and a power supply voltage source in response to the input clock signal.

20. The method of claim 18, wherein the generating of the second clock signal comprises:
- precharging a second load capacitor whose capacity varies according to a value of the at least one lower bit based on a power supply voltage; and
- discharging a second reference current provided from a second current source from the second load capacitor.

* * * * *